US008629545B2

(12) United States Patent
Crisp et al.

(10) Patent No.: US 8,629,545 B2
(45) Date of Patent: Jan. 14, 2014

(54) STUB MINIMIZATION FOR ASSEMBLIES WITHOUT WIREBONDS TO PACKAGE SUBSTRATE

(75) Inventors: Richard Dewitt Crisp, Hornitos, CA (US); Wael Zohni, San Jose, CA (US); Belgacem Haba, Saratoga, CA (US); Frank Lambrecht, Mountain View, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/439,354

(22) Filed: Apr. 4, 2012

(65) Prior Publication Data

US 2013/0082375 A1    Apr. 4, 2013

Related U.S. Application Data

(60) Provisional application No. 61/542,488, filed on Oct. 3, 2011, provisional application No. 61/542,553, filed on Oct. 3, 2011, provisional application No. 61/542,495, filed on Oct. 3, 2011, provisional application No. 61/600,361, filed on Feb. 17, 2012.

(51) Int. Cl.
*H01L 23/02* (2006.01)

(52) U.S. Cl.
USPC .... 257/686; 257/690; 257/777; 257/E21.502; 257/E25.013; 257/E25.018; 438/107; 438/109; 361/760; 365/51; 365/63

(58) Field of Classification Search
CPC ............... H01L 23/49833; H01L 23/49838
USPC ............... 257/685, 686, 690, 707, 713, 738, 257/773–778, E21.502, E21.503, E21.504, 257/E25.013, E25.018; 438/107–110; 361/760, 770–790; 365/51, 63, 191, 365/193, 198
See application file for complete search history.

(56) References Cited

U.S. PATENT DOCUMENTS

| | | |
|---|---|---|
| 3,670,208 A | 6/1972 | Hovnanian et al. |
| 5,148,265 A | 9/1992 | Khandros et al. |

(Continued)

FOREIGN PATENT DOCUMENTS

| | | |
|---|---|---|
| EP | 1205977 A2 | 5/2002 |
| JP | 2002-076252 A | 3/2002 |

(Continued)

OTHER PUBLICATIONS

Kang, et al., 8Gb 3D DDR3 DRAM Using Through-Silicon-Via Technology, IEEE, International Solid-State Circuits Conference, 2009, Samsung Electronics, Hwasung, Korea, (2009).

(Continued)

*Primary Examiner* — Khiem D Nguyen
(74) *Attorney, Agent, or Firm* — Lerner, David, Littenberg, Krumholz & Mentlik, LLP

(57) ABSTRACT

A system or microelectronic assembly can include one or more microelectronic packages each having a substrate and a microelectronic element having a face and one or more columns of contacts thereon which face and are joined to corresponding contacts on a surface of the substrate. An axial plane may intersect the face along a line in the first direction and centered relative to the columns of element contacts. Columns of package terminals can extend in the first direction. First terminals in a central region of the second surface can be configured to carry address information usable to determine an addressable memory location within the microelectronic element. The central region may have a width not more than three and one-half times a minimum pitch between the columns of package terminals. The axial plane can intersect the central region.

28 Claims, 21 Drawing Sheets

(56) References Cited

U.S. PATENT DOCUMENTS

| | | |
|---|---|---|
| 5,148,266 A | 9/1992 | Khandros et al. |
| 5,480,840 A | 1/1996 | Barnes et al. |
| 5,679,977 A | 10/1997 | Khandros et al. |
| 5,777,391 A | 7/1998 | Nakamura et al. |
| 5,821,614 A * | 10/1998 | Hashimoto et al. ........... 257/679 |
| 5,929,517 A | 7/1999 | Distefano et al. |
| 5,936,305 A | 8/1999 | Akram |
| 5,973,403 A | 10/1999 | Wark |
| 6,086,386 A | 7/2000 | Fjelstad et al. |
| 6,130,116 A | 10/2000 | Smith et al. |
| 6,197,665 B1 | 3/2001 | DiStefano et al. |
| 6,252,264 B1 | 6/2001 | Bailey et al. |
| 6,255,899 B1 | 7/2001 | Bertin et al. |
| 6,261,867 B1 | 7/2001 | Robichaud et al. |
| 6,297,960 B1 | 10/2001 | Moden et al. |
| 6,323,436 B1 | 11/2001 | Hedrick et al. |
| 6,343,019 B1 | 1/2002 | Jiang et al. |
| 6,376,769 B1 | 4/2002 | Chung |
| 6,380,318 B1 | 4/2002 | Saito et al. |
| 6,384,473 B1 | 5/2002 | Peterson et al. |
| 6,426,560 B1 | 7/2002 | Kawamura et al. |
| 6,445,594 B1 | 9/2002 | Nakagawa et al. |
| 6,452,266 B1 | 9/2002 | Iwaya et al. |
| 6,462,423 B1 | 10/2002 | Akram et al. |
| 6,577,004 B1 | 6/2003 | Rumsey et al. |
| 6,617,695 B1 | 9/2003 | Kasatani |
| 6,619,973 B2 | 9/2003 | Perino et al. |
| 6,620,648 B2 | 9/2003 | Yang |
| 6,633,078 B2 | 10/2003 | Hamaguchi et al. |
| 6,661,089 B2 | 12/2003 | Huang |
| 6,692,987 B2 | 2/2004 | Lim et al. |
| 6,707,141 B2 | 3/2004 | Akram |
| 6,720,666 B2 | 4/2004 | Lim et al. |
| 6,742,098 B1 | 5/2004 | Halbert et al. |
| 6,744,137 B2 | 6/2004 | Kinsman |
| 6,765,288 B2 | 7/2004 | Damberg |
| 6,781,220 B2 | 8/2004 | Taube et al. |
| 6,821,815 B2 | 11/2004 | Smith et al. |
| 6,836,007 B2 | 12/2004 | Michii et al. |
| 6,876,088 B2 | 4/2005 | Harvey |
| 6,894,379 B2 | 5/2005 | Feurle |
| 6,894,381 B2 | 5/2005 | Hetzel et al. |
| 6,906,415 B2 | 6/2005 | Jiang et al. |
| 6,943,057 B1 | 9/2005 | Shim et al. |
| 6,982,485 B1 | 1/2006 | Lee et al. |
| 7,061,092 B2 | 6/2006 | Akram et al. |
| 7,061,105 B2 | 6/2006 | Masuda et al. |
| 7,061,121 B2 | 6/2006 | Haba |
| 7,091,064 B2 | 8/2006 | Jiang |
| 7,138,709 B2 | 11/2006 | Kumamoto |
| 7,145,226 B2 | 12/2006 | Kumamoto |
| 7,170,158 B2 | 1/2007 | Choi et al. |
| 7,262,507 B2 | 8/2007 | Hino et al. |
| 7,272,888 B2 | 9/2007 | DiStefano |
| 7,324,352 B2 | 1/2008 | Goodwin |
| 7,368,319 B2 | 5/2008 | Ha et al. |
| 7,372,169 B2 | 5/2008 | Chang |
| 7,389,937 B2 | 6/2008 | Ito |
| 7,405,471 B2 | 7/2008 | Kledzik et al. |
| 7,414,312 B2 | 8/2008 | Nguyen et al. |
| 7,476,975 B2 | 1/2009 | Ogata |
| 7,518,226 B2 | 4/2009 | Cablao et al. |
| 7,535,110 B2 | 5/2009 | Wu et al. |
| 7,550,842 B2 | 6/2009 | Khandros et al. |
| 7,589,409 B2 | 9/2009 | Gibson et al. |
| 7,633,146 B2 | 12/2009 | Masuda et al. |
| 7,633,147 B2 | 12/2009 | Funaba et al. |
| 7,642,635 B2 | 1/2010 | Kikuchi et al. |
| 7,692,931 B2 | 4/2010 | Chong et al. |
| 7,763,964 B2 | 7/2010 | Matsushima |
| RE41,478 E | 8/2010 | Nakamura et al. |
| RE41,721 E | 9/2010 | Nakamura et al. |
| RE41,722 E | 9/2010 | Nakamura et al. |
| 7,795,721 B2 | 9/2010 | Kurita |
| RE41,972 E | 11/2010 | Lenander et al. |
| 7,989,940 B2 | 8/2011 | Haba et al. |
| RE42,972 E | 11/2011 | Nakamura et al. |
| 2001/0002727 A1 | 6/2001 | Shiraishi et al. |
| 2001/0022740 A1 | 9/2001 | Nuxoll et al. |
| 2002/0000583 A1 | 1/2002 | Kitsukawa et al. |
| 2002/0027019 A1 | 3/2002 | Hashimoto |
| 2002/0030261 A1 | 3/2002 | Rolda et al. |
| 2002/0053727 A1 | 5/2002 | Kimura |
| 2002/0053732 A1 | 5/2002 | Iwaya et al. |
| 2002/0066950 A1 | 6/2002 | Joshi |
| 2002/0171142 A1 | 11/2002 | Kinsman |
| 2003/0064547 A1 | 4/2003 | Akram et al. |
| 2003/0089978 A1 | 5/2003 | Miyamoto et al. |
| 2003/0089982 A1 | 5/2003 | Feurle |
| 2003/0107908 A1 | 6/2003 | Jang et al. |
| 2003/0205801 A1 | 11/2003 | Baik et al. |
| 2003/0211660 A1 | 11/2003 | Lim et al. |
| 2004/0016999 A1 | 1/2004 | Misumi |
| 2004/0061211 A1 | 4/2004 | Michii et al. |
| 2004/0061577 A1 | 4/2004 | Breisch et al. |
| 2004/0090756 A1 | 5/2004 | Ho et al. |
| 2004/0112088 A1 | 6/2004 | Ueda et al. |
| 2004/0145042 A1 | 7/2004 | Morita et al. |
| 2004/0164382 A1 | 8/2004 | Gerber et al. |
| 2004/0184240 A1 | 9/2004 | Su |
| 2005/0116358 A1 | 6/2005 | Haba |
| 2005/0194672 A1 | 9/2005 | Gibson et al. |
| 2005/0206585 A1 | 9/2005 | Stewart et al. |
| 2005/0258532 A1 | 11/2005 | Yoshikawa et al. |
| 2006/0004981 A1 | 1/2006 | Bains |
| 2006/0081983 A1 | 4/2006 | Humpston et al. |
| 2006/0207788 A1 | 9/2006 | Yoon et al. |
| 2006/0290005 A1 | 12/2006 | Thomas et al. |
| 2007/0025131 A1 | 2/2007 | Ruckerbauer et al. |
| 2007/0108592 A1 | 5/2007 | Lai et al. |
| 2007/0120245 A1 | 5/2007 | Yoshikawa et al. |
| 2007/0143553 A1 | 6/2007 | LaBerge |
| 2007/0187836 A1* | 8/2007 | Lyne ........................... 257/777 |
| 2007/0241441 A1 | 10/2007 | Choi et al. |
| 2008/0012110 A1 | 1/2008 | Chong et al. |
| 2008/0061423 A1 | 3/2008 | Brox et al. |
| 2008/0088033 A1 | 4/2008 | Humpston et al. |
| 2008/0098277 A1 | 4/2008 | Hazelzet |
| 2008/0150155 A1 | 6/2008 | Periaman et al. |
| 2008/0182443 A1 | 7/2008 | Beaman et al. |
| 2008/0185705 A1 | 8/2008 | Osborn et al. |
| 2008/0230888 A1 | 9/2008 | Sasaki |
| 2008/0265397 A1 | 10/2008 | Lin et al. |
| 2009/0065948 A1 | 3/2009 | Wang |
| 2009/0108425 A1 | 4/2009 | Lee et al. |
| 2009/0200680 A1 | 8/2009 | Shinohara et al. |
| 2009/0250255 A1 | 10/2009 | Shilling et al. |
| 2009/0250822 A1* | 10/2009 | Chen et al. .................... 257/777 |
| 2009/0294938 A1 | 12/2009 | Chen |
| 2009/0314538 A1 | 12/2009 | Jomaa et al. |
| 2010/0052111 A1 | 3/2010 | Urakawa |
| 2010/0102428 A1 | 4/2010 | Lee et al. |
| 2010/0182040 A1 | 7/2010 | Feng et al. |
| 2010/0244272 A1 | 9/2010 | Lee et al. |
| 2010/0244278 A1 | 9/2010 | Shen |
| 2010/0295166 A1 | 11/2010 | Kim |
| 2010/0301466 A1 | 12/2010 | Taoka et al. |
| 2010/0327457 A1 | 12/2010 | Mabuchi |
| 2011/0042824 A1 | 2/2011 | Koide |
| 2011/0193178 A1 | 8/2011 | Chang et al. |
| 2011/0193226 A1 | 8/2011 | Kirby et al. |
| 2011/0254156 A1 | 10/2011 | Lin |
| 2012/0018863 A1 | 1/2012 | Oganesian et al. |
| 2012/0020026 A1 | 1/2012 | Oganesian et al. |

FOREIGN PATENT DOCUMENTS

| | | |
|---|---|---|
| JP | 2004-063767 A | 2/2004 |
| JP | 2008-198841 A | 8/2008 |
| JP | 3143893 U | 8/2008 |
| JP | 2010-098098 A | 4/2010 |
| KR | 2001-0002214 A | 1/2001 |
| KR | 2005-0119414 A | 12/2005 |
| KR | 2006-0120365 A | 11/2006 |

(56) References Cited

FOREIGN PATENT DOCUMENTS

| KR | 2007-0088177 A | 8/2007 |
|---|---|---|
| KR | 2009-0008341 A | 1/2009 |
| KR | 2009-0086314 A | 8/2009 |
| TW | M338433 U | 8/2008 |
| WO | 2010120310 A1 | 10/2010 |

OTHER PUBLICATIONS

U.S. Appl. No. 13/306,300, filed Nov. 29, 2011.
U.S. Appl. No. 13/346,201, filed Jan. 9, 2012.
U.S. Appl. No. 13/080,876, filed Apr. 6, 2011.
U.S. Appl. No. 13/306,068, filed Nov. 29, 2011.
U.S. Appl. No. 13/346,185, filed Jan. 9, 2012.
U.S. Appl. No. 13/337,565, filed Dec. 27, 2011.
U.S. Appl. No. 13/440,313, filed Apr. 5, 2012.
U.S. Appl. No. 13/439,317, filed Apr. 5, 2012.
U.S. Appl. No. 13/440,212, filed Apr. 5, 2012.
U.S. Appl. No. 13/439,286, filed Apr. 5, 2012.
U.S. Appl. No. 13/354,747, filed Jan. 20, 2012.
U.S. Appl. No. 13/354,772, filed Jan. 20, 2012.
Kang, et al., 8Gb 3D DDR3 DRAM Using Through-Silicon-Via Technology, IEEE, International Solid-State Circuits Conference, 2009, pp. 130-132, (2009).
U.S. Appl. No. 13/337,575, filed Dec. 27, 2011.
U.S. Appl. No. 13/440,515, filed Apr. 5, 2012.
Sandforce, "SF-2200 & SF-2100 Client SSD Processors", 2011.
U.S. Appl. No. 13/439,299, filed Apr. 4, 2012.
U.S. Appl. No. 13/439,273, filed Apr. 4, 2012.
U.S. Appl. No. 13/439,228, filed Apr. 4, 2012.
U.S. Appl. No. 13/440,299, filed Apr. 5, 2012.
U.S. Appl. No. 13/440,290, filed Apr. 5, 2012.
U.S. Appl. No. 13/440,199, filed Apr. 5, 2012.
U.S. Appl. No. 13/440,280, filed Apr. 5, 2012.
Partial International Search Report dated Oct. 26, 2012 in International Patent Appl. No. PCT/US2012/046049.
Partial International Search Report dated Oct. 12, 2012 in International Patent Appl. No. PCT/US2012/046249.
Partial International Search Report dated Oct. 12, 2012 in International Patent Appl. No. PCT/US2012/046255.
US Non Final Office Action dated Oct. 18, 2012 for U.S. Appl. No. 13/439,299.
International Search Report and Written Opinion for Application No. PCT/US2012/046049 dated Jan. 10, 2013.
International Search Report and Written Opinion for Application No. PCT/US2012/046049 dated Nov. 29, 2012.
US Amendment for U.S. Appl. No. 13/439,299 dated Jan. 18, 2013.
Elpida User's Manual, "Introduction to GDDR5 SGRAM", Document No. E1600E10 (Ver. 1.0), Published Mar. 2010, Japan, URL: http:'www.elpida.com.
Hynix, "2GB (64Mx32) GDDR5 SGRAM HRGQ2H24AFR", Nov. 2011-Feb. 2012.
Partial Search Report for Application No. PCT/US2012/000425 dated Jan. 30, 2013.
Partial Search Report for Application No. PCT/US2012/057170 dated Jan. 31, 2013.
Partial Search Report for Application No. PCT/US2012/057554 dated Jan. 24, 2013.
Partial Search Report for Application No. PCT/US2012/058273 dated Jan. 24, 2013.
Partial Search Report for Application No. PCT/US2012/058557 dated Feb. 4, 2013.
International Search Report and Written Opinion dated Mar. 21, 2013 for Application No. PCT/US2012/000425.
International Search Report and Written Opinion dated Mar. 21, 2013 for Application No. PCT/US2012/057911.
International Search Report and Written Opinion for Application No. PCT/US2012/046249 dated Mar. 20, 2013.
International Search Report and Written Opinion for Application No. PCT/US2012/046255 dated Mar. 20, 2013.
International Search Report and Written Opinion for Application No. PCT/US2012/057170 dated Mar. 22, 2013.
International Search Report and Written Opinion for Application No. PCT/US2012/057179 dated Apr. 4, 2013.
International Search Report and Written Opinion for Application No. PCT/US2012/057200 dated Mar. 1, 2013.
International Search Report and Written Opinion for Application No. PCT/US2012/057554 dated Feb. 28, 2013.
International Search Report and Written Opinion for Application No. PCT/US2012/057563 dated Mar. 5, 2013.
International Search Report and Written Opinion for Application No. PCT/US2012/058273 dated Mar. 6, 2013.
International Search Report and Written Opinion for Application No. PCT/US2012/058398 dated Jul. 4, 2013.
International Search Report and Written Opinion for Application No. PCT/US2012/058407 dated Mar. 28, 2013.
International Search Report and Written Opinion for Application No. PCT/US2012/058423 dated Mar. 20, 2013.
International Search Report and Written Opinion for Application No. PCT/US2012/058434 dated Jun. 21, 2013.
International Search Report and Written Opinion for Application No. PCT/US2012/058557 dated Mar. 12, 2013.
International Search Report and Written Opinion for Application No. PCT/US2012/057895 dated Jun. 10, 2013.
International Search Report and Written Opinion for Application No. PCT/US2012/058229 dated Jul. 3, 2013.

* cited by examiner

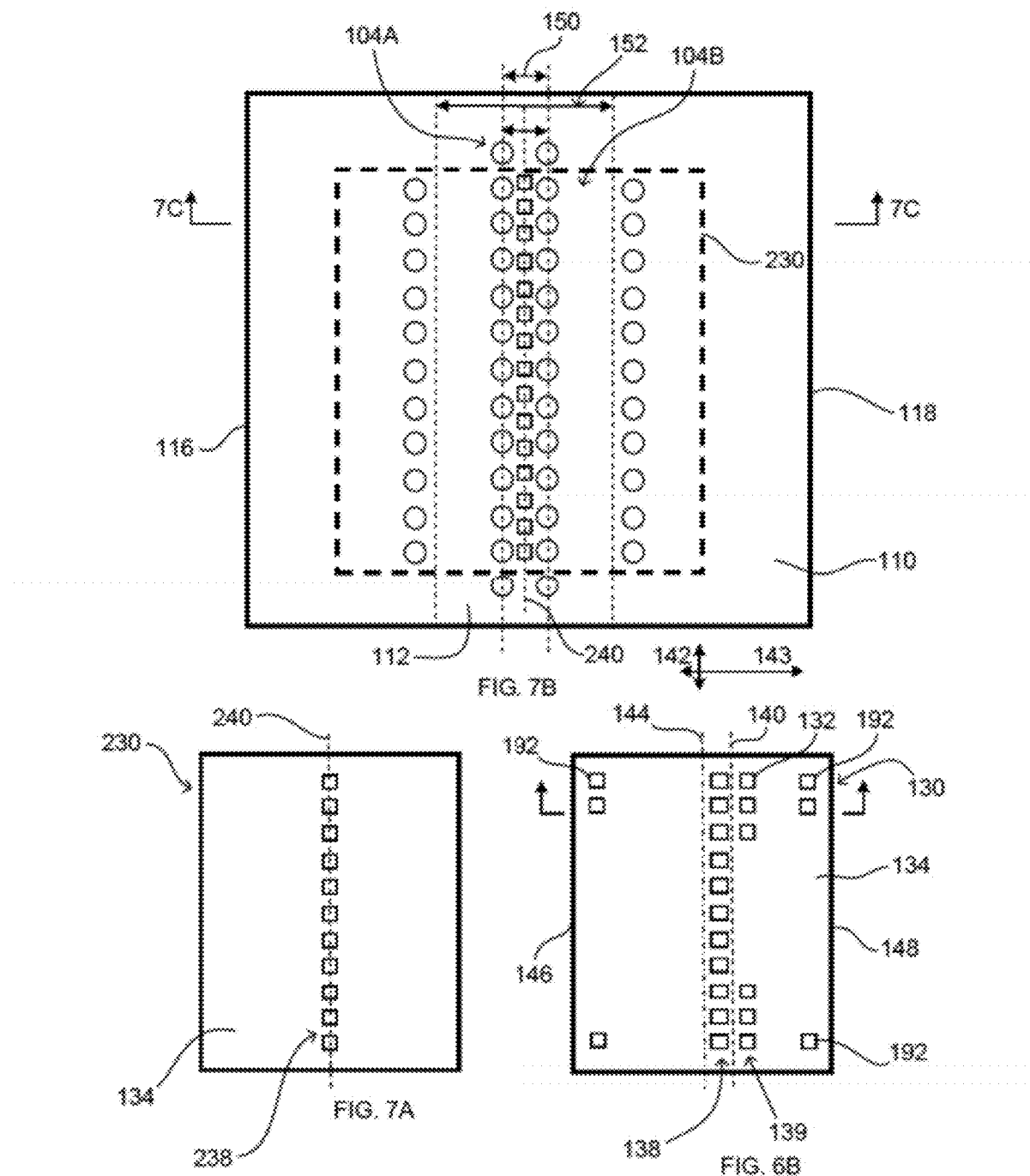

STUB MINIMIZATION FOR ASSEMBLIES WITHOUT WIREBONDS TO PACKAGE SUBSTRATE

CROSS-REFERENCE TO RELATED APPLICATIONS

This application claims the benefit of U.S. Provisional Patent Applications 61/542,488, 61/542,495, and 61/542,553, each filed Oct. 3, 2011, and U.S. Provisional Patent Application 61/600,361 filed Feb. 17, 2012. The disclosures of said applications are incorporated by reference herein.

BACKGROUND OF THE INVENTION

The subject matter of the present application relates to microelectronic packages and assemblies incorporating microelectronic packages.

Semiconductor chips are commonly provided as individual, prepackaged units. A standard chip has a flat, rectangular body with a large front face having contacts connected to the internal circuitry of the chip. Each individual chip typically is contained in a package having external terminals which, in turn, are electrically connected to a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face.

In "flip chip" designs, the front face of the chip confronts the face of a package dielectric element, i.e., substrate of the package, and the contacts on the chip are bonded directly to contacts of the substrate by solder bumps or other connecting elements. In turn, the substrate can be bonded to a circuit panel through terminals overlying the face of the substrate. The "flip chip" design provides a relatively compact arrangement. In some cases, each package can be a "chip-scale package" which occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference. Certain innovative mounting techniques offer compactness approaching or equal to that of conventional flip-chip bonding. Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The interconnections should be short to minimize signal propagation delays. The components which form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips are commonly packaged in multiple-chip packages and assemblies. Each package has many electrical connections for carrying signals, power and ground between terminals, i.e., external connection points of the package, and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds which extending in both horizontal and vertical directions relative to the surface of the chip.

Conventional microelectronic packages can incorporate a microelectronic element predominantly having memory storage array function, i.e., one that embodies a greater number of active devices to provide memory storage array function than any other function. The microelectronic element may be or include a dynamic random access memory (DRAM) chip, or a stacked electrically interconnected assembly of such semiconductor chips. Typically, all of the terminals of such package are placed in sets of columns adjacent to one or more peripheral edges of a package substrate to which the microelectronic element is mounted. For example, in one conventional microelectronic package 12 seen in FIG. 1, three columns 14 of terminals can be disposed adjacent a first peripheral edge 16 of the package substrate 20 and three other columns 18 of terminals can be disposed adjacent a second peripheral edge 22 of the package substrate 20. A central region 24 of the package substrate 20 in the conventional package does not have any columns of terminals. FIG. 1 further shows a semiconductor chip 11 within the package having element contacts 26 on a face 28 thereof which are electrically interconnected with the columns 14, 18 of terminals of the package 12 with wire bonds extending through an aperture, e.g., bond window, in the central region 24 of package substrate 20. In some cases, an adhesive layer 32 may be disposed between the face 28 of the microelectronic element 11 and the substrate 20 to reinforce the mechanical connection between the microelectronic element and the substrate, with the wire bonds extending through an opening in the adhesive layer 32.

In light of the foregoing, certain improvements in the positioning of terminals on microelectronic packages can be made in order to improve electrical performance, particularly in assemblies which include such packages and a circuit panel to which such packages can be mounted and electrically interconnected with one another.

SUMMARY OF THE INVENTION

A microelectronic assembly according to an embodiment of the invention can have a circuit panel having first and second opposed surfaces and panel contacts at each of the first and second opposed surfaces. First and second microelectronic packages can have terminals electrically connected with the panel contacts at the first and second surfaces. The circuit panel can electrically interconnect at least some terminals of the first microelectronic package with at least some corresponding terminals of the second microelectronic package.

In one example, each of the first and second microelectronic packages can include a microelectronic element embodying a greater number of active devices to provide memory storage array function than any other function. The microelectronic element may have one or more columns of element contacts each column extending in a first direction along a face of the microelectronic element. An axial plane normal to the face of the microelectronic element can intersect the face of the microelectronic element along a line extending in the first direction and centered relative to the one or more columns of element contacts. The microelectronic package may include a substrate having first and second opposed surfaces and a plurality of substrate contacts at the first surface facing the element contacts and joined thereto. A plurality of parallel columns of terminals can extend in the first direction at the second surface of the substrate. The terminals can be electrically connected with the substrate contacts and configured to connect the microelectronic package with a component external to the microelectronic package.

The terminals can include first terminals exposed in a central region of the second surface of the substrate. The first terminals can be configured to carry address information usable by circuitry within the package to determine an addressable memory location from among all the available addressable memory locations of a memory storage array within the microelectronic element. In one example, the central region of the second surface can have a width in a second direction along the second surface of the substrate transverse to the first direction, in which the width may be not more than three and one-half times a minimum pitch between any two adjacent columns of the parallel columns of the terminals. In such example, the axial plane can intersect the central region.

In one example, at least some of the first terminals of each of the first and second microelectronic packages can be disposed at positions within a grid on the respective package, and the grids can be aligned within one ball pitch of one another in x and y orthogonal directions parallel to the first and second circuit panel surfaces.

In one example, the grids can be aligned with one another in the x and y orthogonal directions such that the at least some first terminals of the grids of each of the first and second microelectronic packages can be coincident with one another.

In one example, each position of each grid can be occupied by one of the terminals.

In one example, at least one position of at least one of the grids can be not occupied by a terminal.

In one example, at least half of the positions of the grids of the first and second packages can be aligned with one another in x and y orthogonal directions parallel to the first surface of the circuit panel.

In one example, the first terminals can be disposed at positions within the grid of each microelectronic package can be configured to carry all of the address information usable by the circuitry within the respective microelectronic package to determine the addressable memory location.

In one example, the first terminals disposed at positions within the grid of each microelectronic package can be configured to carry information that controls an operating mode of the microelectronic element of the respective microelectronic package.

In one example, the first terminals disposed at positions within the grid of each microelectronic package can be configured to carry all of the command signals transferred to the respective microelectronic package, the command signals can be write enable, row address strobe, and column address strobe signals.

In one example, the first terminals disposed at positions within the grid of each microelectronic package can be configured to carry clock signals transferred to such microelectronic packages. Each microelectronic package can be configured to use the clock signals to sample signals received at the terminals which carry the address information.

In one example, the first terminals disposed at positions within the grid of each microelectronic package can be configured to carry all of the bank address signals transferred to the respective microelectronic package.

In one example, a length of a stub of at least one of electrical connections between one of the first terminals of the first microelectronic package and a corresponding one of the first terminals of the second microelectronic package can be less than seven times a minimum pitch of the first terminals on the first microelectronic package.

In one example, at least some of the electrical connections through the circuit panel between the first terminals of the first microelectronic package and the first terminals of the second microelectronic package can have an electrical length of approximately a thickness of the circuit panel.

In one example, the total combined length of the conductive elements connecting each pair of electrically coupled first and second panel contacts exposed at the first and second surfaces of the circuit panel can be less than seven times a smallest pitch of the panel contacts.

In one example, the circuit panel can include a bus having a plurality of conductors configured to carry at least some of the address information transferred to each of the microelectronic packages, the conductors extending in a first direction parallel to the first and second surfaces.

In one example, the first terminals of each microelectronic package can be disposed at positions within a single column of the grid of the respective microelectronic package. In one example, the circuit panel may include no more than one routing layer for routing of all of the address information between a connection site on the circuit panel at which the terminals of the first and second microelectronic packages can be electrically connected and a different connection site at which the terminals of at least a third microelectronic package can be electrically connected.

In one example, the no more than one routing layer provides routing for command signals, address signals, bank address signals, and clock signals of a command-address bus of the circuit panel between the connection sites.

In one example, the circuit panel can include an element having a coefficient of thermal expansion ("CTE") of less than 12 parts per million per degree Celsius ("ppm/° C."), wherein the panel contacts at the first and second surfaces can be connected by vias extending through the element.

In one example, the element can consist essentially of semiconductor, glass, ceramic or liquid crystal polymer material.

A module according to an embodiment of the invention can include a circuit panel, and a plurality of microelectronic packages mounted to, and electrically connected with the circuit panel through the terminals of each microelectronic package for transport of signals to and from each microelectronic package. In such module, each microelectronic package may include a microelectronic element embodying a greater number of active devices to provide memory storage array function than any other function. The microelectronic element may have one or more columns of element contacts each column extending in a first direction along a face of the microelectronic element. An axial plane normal to the face of the microelectronic element can intersect the face of the microelectronic element along a line extending in the first direction and can be centered relative to the one or more columns of element contacts. The module can further include a substrate having first and second opposed surfaces and a plurality of substrate contacts at the first surface facing the element contacts and joined thereto.

A plurality of parallel columns of terminals can extend in the first direction at the second surface of the substrate. The terminals can be electrically connected with the substrate contacts and be configured to connect the microelectronic package with a component external to the microelectronic package. The terminals can include first terminals exposed in a central region of the second surface of the substrate which are configured to carry address information usable by circuitry within the package to determine an addressable memory location from among all the available addressable memory locations of a memory storage array within the microelectronic element. In such embodiment, the central region has a width in a second direction along the second surface of the substrate transverse to the first direction, the width of the central region being not more than three and one-half times a minimum pitch between any two adjacent columns of the parallel columns of the terminals, and the axial plane intersects the central region.

A microelectronic assembly according to an embodiment of the invention can include a circuit panel having first and second opposed surfaces and panel contacts at each of the first and second opposed surfaces, and first and second microelectronic packages having terminals mounted to the panel contacts at the first and second surfaces, respectively. The circuit panel can electrically interconnect at least some terminals of the first microelectronic package with at least some corresponding terminals of the second microelectronic package. In such example, each of the first and second microelectronic packages can include a microelectronic element embodying a greater number of active devices to provide memory storage array function than any other function. The microelectronic element may have one or more columns of element contacts each column extending in a first direction along a face of the microelectronic element, such that an axial plane extending in a direction normal to the face of the microelectronic element intersects the face of the microelectronic element along a line extending in the first direction and centered relative to the one or more columns of element contacts. The microelectronic package can further include packaging structure such as a dielectric layer having a surface overlying the face of the microelectronic element and facing away from the face of the microelectronic element, and a plurality of terminals exposed at the surface of the dielectric layer. At least some of the terminals can be electrically connected with the element contacts through traces extending along the dielectric layer and metallized vias extending from the traces and contacting the element contacts. The terminals can be disposed at positions within a plurality of parallel columns and can be configured for connecting the microelectronic package to at least one component external to the microelectronic package, the terminals including first terminals disposed within at least one column in the central region. The first terminals can be configured to carry address information usable by circuitry within the package to determine an addressable memory location from among all the available addressable memory locations of a memory storage array within the microelectronic element. In one example, the central region can be not wider than three and one-half times a minimum pitch between any two adjacent columns of the terminals, and the axial plane may intersect the central region.

In one example, at least some of the first terminals of each of the first and second microelectronic packages can be disposed at positions within a grid on the respective package, and the grids can be aligned within one ball pitch of one another in x and y orthogonal directions parallel to the first and second circuit panel surfaces. The first terminals disposed at positions within the grid of each microelectronic package can be configured to carry information that controls an operating mode of the microelectronic element of the respective microelectronic package.

In one example, the first terminals can be disposed at positions within the grid of each microelectronic package can be configured to carry all of the command signals transferred to the respective microelectronic package, and the command signals can be write enable, row address strobe, and column address strobe signals.

In one example, at least some of the electrical connections through the circuit panel between the first terminals of the first and second microelectronic packages can have an electrical length of approximately a thickness of the circuit panel.

In one example, the total combined length of the conductive elements connecting each pair of electrically coupled first and second panel contacts exposed at the first and second surfaces of the circuit panel can be less than seven times a smallest pitch of the panel contacts.

A system according to an embodiment of the invention can include a microelectronic package, and one or more other electronic components electrically connected with the microelectronic package. In one example, the microelectronic package can include a microelectronic element embodying a greater number of active devices to provide memory storage array function than any other function. The microelectronic element may have one or more columns of element contacts each column extending in a first direction along a face of the microelectronic element. An axial plane normal to the face of the microelectronic element can intersect the face of the microelectronic element along a line extending in the first direction and centered relative to the one or more columns of element contacts. The microelectronic package may include a substrate having first and second opposed surfaces and a plurality of substrate contacts at the first surface facing the element contacts and joined thereto. A plurality of parallel columns of terminals can extend in the first direction at the second surface of the substrate. The terminals can be electrically connected with the substrate contacts and configured to connect the microelectronic package with a component external to the microelectronic package.

The terminals can include first terminals exposed in a central region of the second surface of the substrate. The first terminals can be configured to carry address information usable by circuitry within the package to determine an addressable memory location from among all the available addressable memory locations of a memory storage array within the microelectronic element. In one example, the central region of the second surface can have a width in a second direction along the second surface of the substrate transverse to the first direction, in which the width may be not more than three and one-half times a minimum pitch between any two adjacent columns of the parallel columns of the terminals. In such example, the axial plane can intersect the central region.

In one example, the microelectronic package and the one or more other electronic components can be mounted to the housing.

In one example, the microelectronic package can be a first microelectronic package, the system can include a second microelectronic package.

BRIEF DESCRIPTION OF THE DRAWINGS

FIG. 6B is a plan view further illustrating a possible arrangement of element contacts and types of contacts on a microelectronic element within a microelectronic package according to any of the embodiments claimed herein, among which is the embodiment shown in FIGS. 5 and 6A.

FIG. 7A is a plan view further illustrating another possible arrangement of element contacts on a microelectronic element within a microelectronic package according to the embodiment shown in FIGS. 5 and 6A.

FIG. 7B is a plan view further illustrating an arrangement of terminals in accordance with the embodiment shown in FIGS. 5 and 6A.

FIG. 15A is a diagrammatic plan view illustrating a signal assignment of terminals on a microelectronic package according to the embodiment shown in FIG. 14, wherein FIG. 14 is a sectional view through line 14-14 of FIG. 15A.

DETAILED DESCRIPTION

Figure 1:
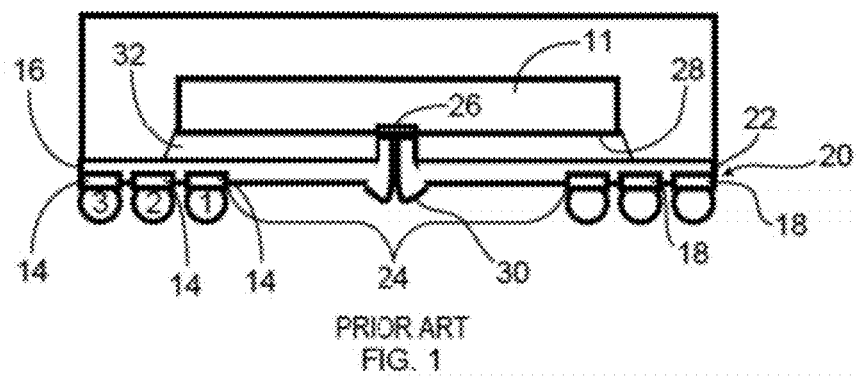
FIG. 1 is a sectional view illustrating a conventional microelectronic package containing a DRAM chip.

In view of the illustrative conventional microelectronic package 12 described relative to FIG. 1, the inventors have recognized improvements which can be made that may help improve the electrical performance of a package incorporating a memory storage array chip, and an assembly which incorporates such package.

Figure 2:
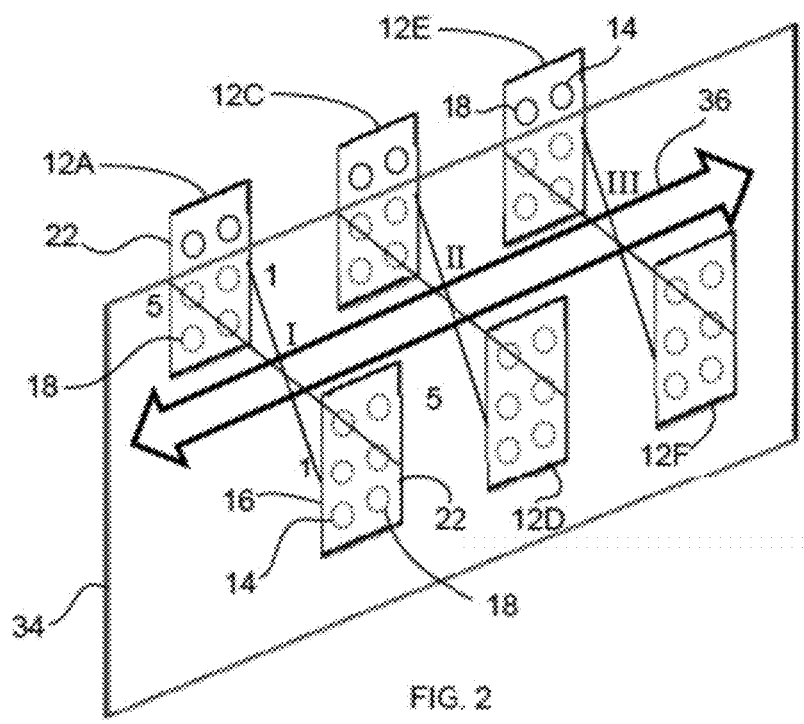
FIG. 2 is a diagrammatic schematic diagram illustrating a microelectronic assembly, e.g., a DIMM module, incorporating a circuit panel and a plurality of microelectronic packages mounted opposite one another to first and second opposite surfaces thereof.
Figure 3:
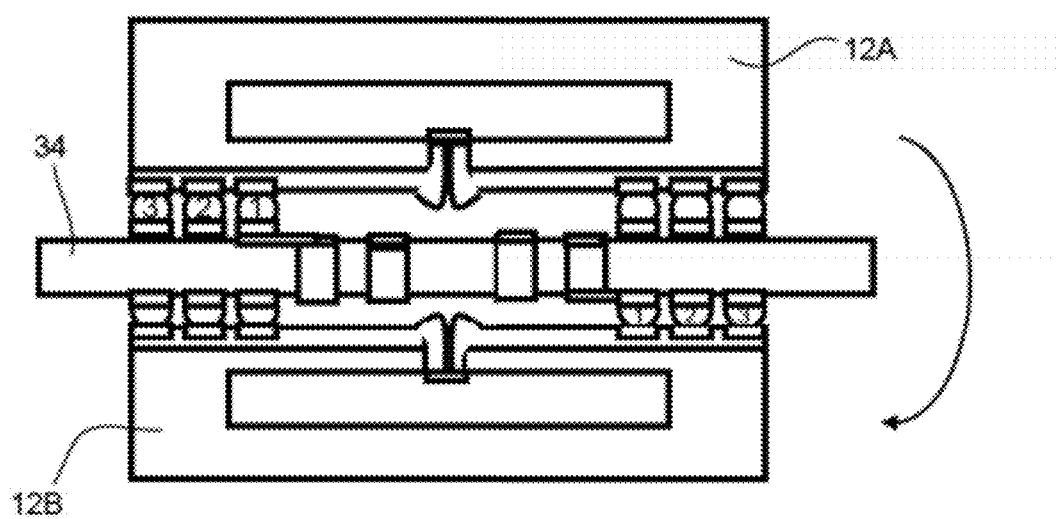
FIG. 3 is a sectional view further illustrating an electrical interconnection between first and second microelectronic packages and a circuit panel in an assembly such as shown in FIG. 2.
Figure 4:
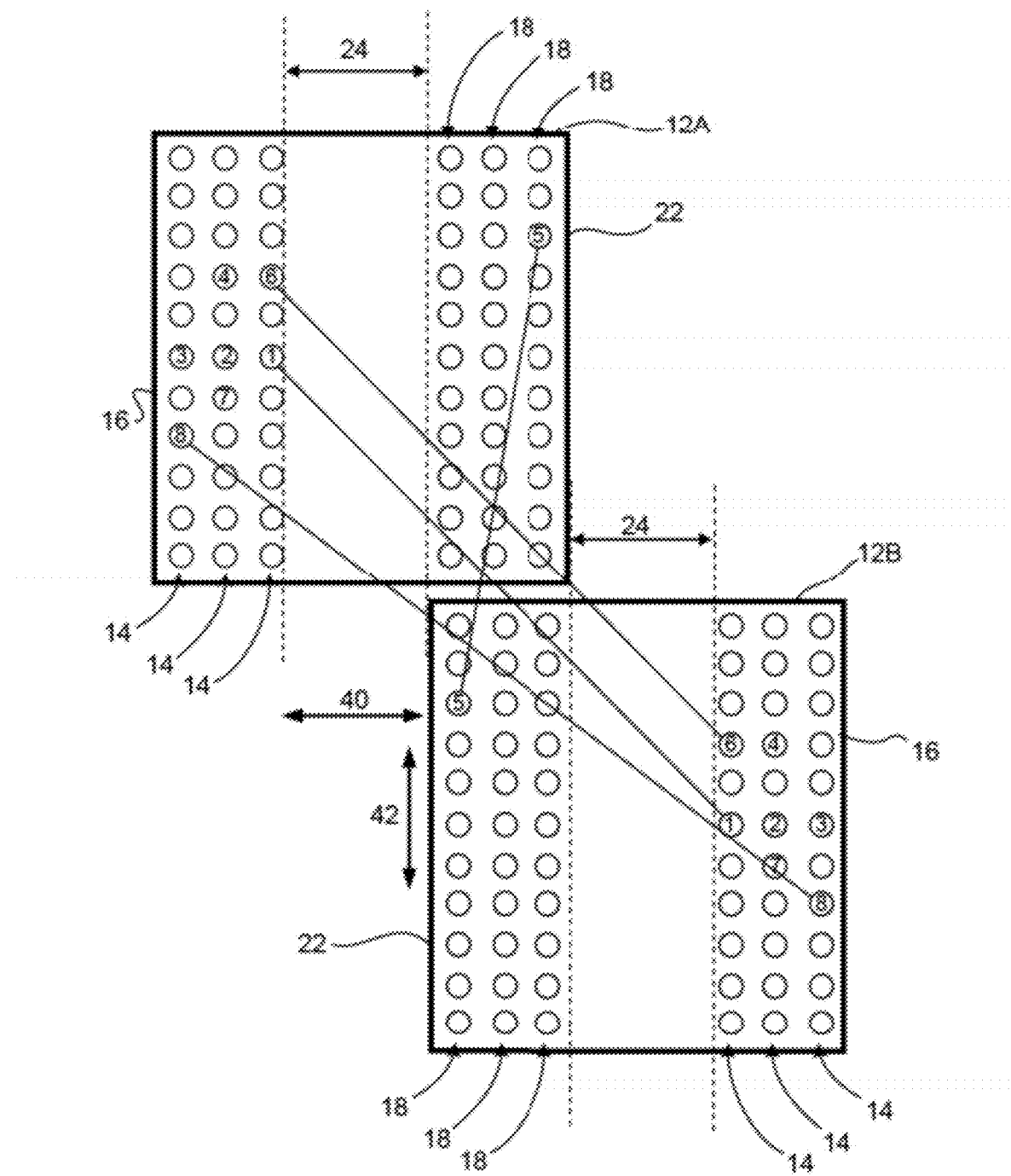
FIG. 4 is a diagrammatic plan view further illustrating the electrical interconnection between first and second microelectronic packages in an assembly such as shown in FIG. 2.

Improvements can be made particularly for use of a microelectronic package when provided in an assembly such as shown in FIGS. 2-4, in which a package 12A is mounted to a surface of a circuit panel with another like package 12B mounted opposite thereto on an opposite surface of the circuit panel. The packages 12A, 12B typically are functionally and mechanically equivalent to one another. Other pairs 12C and 12D; and 12E and 12F, of functionally and mechanically equivalent packages typically are also mounted to the same circuit panel 34. The circuit panel and the packages assembled thereto may form a portion of an assembly commonly referred to as a dual in-line memory module ("DIMM"). The packages in each oppositely mounted pair of packages, e.g., packages 12A, 12B, connect to contacts on opposite surfaces of the circuit panel so that the packages in each pair overlie one another typically by more than 90% of their respective areas. Local wiring within the circuit panel 34 connects terminals, e.g., the terminals labeled "1" and "5" on each package to global wiring on the circuit panel. The global wiring includes the signal conductors of a bus 36 used to conduct some signals to connection sites on the circuit panel 34 such as sites I, II and III. For example, packages 12A, 12B are electrically connected to the bus 36 by local wiring coupled to a connection site I, packages 12C, 12D are electrically connected to the bus by local wiring coupled to connection site II, and packages 12E, 12F are electrically connected to the bus by local wiring coupled to connection site III.

The circuit panel 34 electrically interconnects the terminals of the respective packages 12A, 12B using local interconnect wiring that appears similar to a crisscross or "shoelace" pattern in which a terminal labeled "1" near one edge of package 12A connects through the circuit panel 34 to a terminal labeled "1" of package 12B near the same edge 16 of package 12B. However, the edge 16 of package 12B as assembled to circuit panel 34 is far from the edge 16 of package 12A. FIGS. 2-4 further shows that a terminal labeled "5" near an edge 22 of package 12A is connected through the circuit panel 34 to a terminal labeled "5" of package 12B near the same edge 22 of package 12B. In assembly 38 the edge 22 of package 12A is far from the edge 22 of package 12B.

Connections through the circuit panel between terminals on each package, e.g., package 12A, to the corresponding terminals on the package mounted opposite thereto, i.e., package 12B, are fairly long. As further seen in FIG. 3, in such assembly of like microelectronic packages 12A, 12B, the circuit panel 34 may electrically interconnect a signal conductor of the bus 36 with the terminal of package 12A marked "1" and the corresponding terminal of package 12B marked "1", when the same signal from the bus is to be transmitted to each package. Similarly, the circuit panel 34 may electrically interconnect another signal conductor of the bus 36 with the terminal of package 12A marked "2" and the corresponding terminal of package 12B marked "2". The same connection arrangement may also apply to other signal conductors of the bus and corresponding terminals of each package. Local wiring between the bus 36 on the circuit panel 34 and each package of the respective pair of packages, e.g., packages 12A, 12B (FIG. 2) at a connection site I of the board can be in form of unterminated stubs. Such local wiring when relatively long may in some cases impact the performance of the assembly 38 as discussed below. Moreover, the circuit panel 34 also requires local wiring to electrically interconnect certain terminals of other packages: the pair of packages 12C and 12D, and the pair of packages 12E and 12F to the global wiring of the bus 36, and such wiring can also impact the performance of the assembly in the same way.

FIG. 4 further illustrates the interconnection between microelectronic packages 12A, 12B of respective pairs of terminals assigned to carry signals "1", "2", "3", "4", "5", "6", "7", and "8". As seen in FIG. 4, because the columns 14, 18 of terminals are near the edges 16, 22, respectively, of each package 12A, 12B, the wiring needed to traverse the circuit panel 34 in a direction 40 transverse to the direction 42 in which the columns 14, 18 of terminals extend can be quite long. In recognition that the length of a DRAM chip can be in the range of ten millimeters on each side, the length of the local wiring in a circuit panel 34 in an assembly 38 seen in FIGS. 2-4 that is required to route the same signal to the corresponding terminals of two oppositely mounted packages 12A, 12B can range between five and ten millimeters and may typically be about seven millimeters.

In some cases, the lengths of the circuit panel wiring required to connect the terminals of such oppositely mounted microelectronic packages may not severely impact the electrical performance of the assembly. However, when the signal carried by the connected pair of terminals on the packages 12A, 12B is a signal from a bus 36 used to carry address information or other information such as clock information for sampling the address information which is common to operation of the memory storage array function of a plurality of packages connected to the circuit panel, the inventors recognize that the wiring length of the stubs extending from the bus 36 to the terminals on each package may significantly affect performance. When the interconnecting wiring is relatively long, a more severe impact occurs, which can increase settling time, ringing, jitter, or intersymbol interference for a transmitted signal to an unacceptable degree.

In a particular embodiment, the bus 36 used to carry address information can be a command-address bus 36 configured to carry command information, address information, bank address information and clock information. In a specific implementation, the command information can be transmitted as command signals on respective signal conductors on the circuit panel. It is also possible for the address information to be transmitted as address signals on respective signal conductors, as it is also possible for the bank address information to be transmitted as bank address signals on respective signal conductors, and it is also possible for the clock information to be transmitted as clock signals on respective signal conductors. In a specific implementation of a microelectronic element which has a memory storage array such as a DRAM chip, the command signals which can be carried by the bus 36 can be write enable, row address strobe and column address strobe, and the clock signals which can be carried by the bus 36 can be clock signals used at least for sampling address signals carried by the bus 36.

Accordingly, certain embodiments of the invention described herein provide a microelectronic package configured so as to permit the lengths of stubs on a circuit panel to be reduced when first and second such packages are mounted opposite one another on opposite surfaces of a circuit panel, e.g., a circuit board, module board or card, or flexible circuit panel. Assemblies which incorporate first and second microelectronic packages electrically connected to a circuit panel at locations of the circuit panel opposite from one another can have significantly reduced stub lengths between the respective packages. Reducing the stub lengths within such assemblies can improve electrical performance, such as by reducing one or more of settling time, ringing, jitter, or intersymbol interference, among others. Moreover, it may be possible to obtain other benefits as well, such as simplifying the structure of the circuit panel or reducing the complexity and cost of designing or manufacturing the circuit panel, or for both designing and manufacturing the circuit panel.

Figure 5:
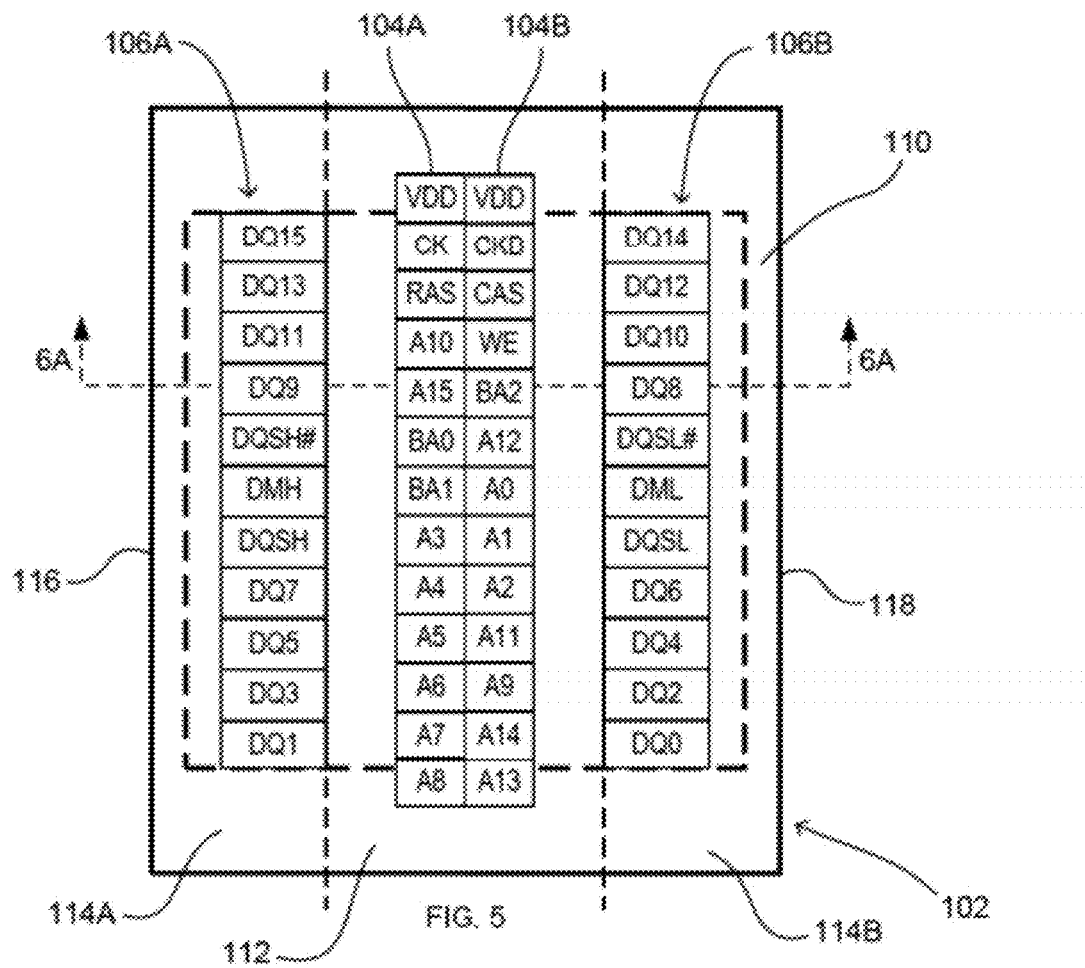
FIG. 5 is a diagrammatic plan view illustrating an arrangement and signal assignment of terminals in a microelectronic package according to an embodiment of the invention.

Thus, a microelectronic package 100 according to an embodiment of the invention is illustrated in FIG. 5. As seen therein, the package 100 can include a microelectronic element 101 configured to predominantly provide memory storage array function, in that the microelectronic element has a greater number of active devices, e.g., transistors, configured to provide memory storage array function than any other function, as indicated above.

Figure 6A:
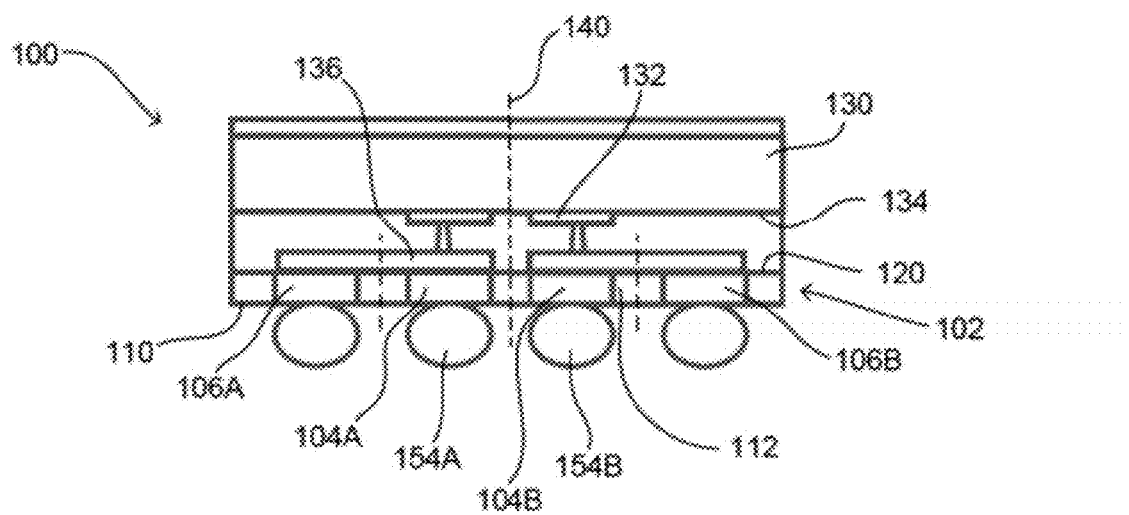
FIG. 6A is a sectional view through line 6A-6A of FIG. 5 further illustrating the microelectronic package shown in FIG. 5.

Thus, a microelectronic package 100 according to an embodiment of the invention is illustrated in FIGS. 5 and 6A. As seen therein, the package can include a substrate 102 on which a plurality of first terminals 104 and a plurality of second terminals 106A and 106B are disposed. The substrate can include a sheet-like dielectric element, which in some cases can consist essentially of polymeric material, e.g., a resin or polyimide, among others. Alternatively, the substrate can include a dielectric element having a composite construction such as glass-reinforced epoxy, e.g., of BT resin or FR-4 construction. In another example, the substrate can include a supporting element of material having a coefficient of thermal expansion ("CTE") of less than 12 parts per million, on which the terminals and other conductive structure are disposed. For example, such low CTE element can consist essentially of glass, ceramic or semiconductor material or liquid crystal polymer material, or a combination of such materials.

The terminals can be disposed at locations within a plurality of parallel columns 104A, 104B, 106A and 106B on a surface 110 of the substrate. In the example shown in FIG. 5, columns 104A and 104B may each contain some first terminals disposed in a central region 112 of the surface 110, and columns 106A, 106B may each contain some terminals in respective peripheral regions 114A, 114B disposed beyond the central region. The central region is not wider than three and one-half times a minimum pitch between adjacent ones of the parallel columns of the terminals, as seen and further described relative to FIG. 7B below. As indicated above, the first terminals can be configured to carry address information transferred to the microelectronic package. In a particular embodiment, the address information can be received by the first terminals from a bus 36 on the circuit panel, e.g., a command-address bus. The address information can be received as individual address signals, e.g., signals A0 through A15 on the respective terminals, or some or all of the address information can be received as a combination of voltage levels received on more than one terminal, e.g., as information in encoded form when received. In a particular embodiment, some or all of the address information can be received on one or more of the terminals on a rising transition of a clock used to sample the information, i.e., a transition of a clock from a first state of higher voltage to a second state of lower voltage, or some or all of the address information can be received on one or more of the terminals on a falling transition of the clock, i.e., a transition of the clock from the second state of lower voltage to the first state of higher voltage. In still another example, some of the address information can be received on one or more of the terminals on a rising transition of the clock while some or the address information can be received on one or more of the terminals on a falling transition of the clock.

As described above, the second terminals 106A, 106B may be disposed at positions within one or more of first and second peripheral regions 114A, 114B of the substrate surface 110. The first and second peripheral regions may in some cases be adjacent to first and second opposed edges 116, 118 of the surface 110, as seen in FIG. 5. The central region 104 is disposed between the first and second peripheral regions 114A, 114B. Typically, when the microelectronic package has second terminals, the second terminals are disposed at locations within one or more columns each having a plurality of second terminals.

In a particular example, when the microelectronic element includes or is a DRAM semiconductor chip, the terminals in the central region can be configured to carry address information transferred to the microelectronic package which is usable by circuitry within the package, e.g., by row address and column address decoders, and bank selection circuitry, if present, to determine an addressable memory location from among all the available addressable memory locations of a memory storage array within the microelectronic element. Typically, when the microelectronic element includes a DRAM chip, the address information in one embodiment can include all address information transferred to the package from a component external to the package, e.g., a circuit panel, which is used for determining a random access addressable memory location within a memory storage array within the microelectronic package for read access thereto, or for either read or write access thereto.

In a specific implementation, such as when the microelectronic element is of a type which receives address signals from a command-address bus on the circuit panel, the first terminals may be configured to carry address signals, bank address signals, certain command signals, and clock signals which are clocks used for sampling the address signals. While the clock signals can be of various types, in one embodiment, the clock signals carried by these terminals can be one or more pairs of differential clock signals received as differential or true and complement clock signals. The "command signals" in this case can be a write enable signal, a row address strobe signal, and a column address strobe signal utilized by a microelectronic element within the microelectronic package. For example, in a particular example as seen in FIG. 5, the first terminals can include clock signals CK and CKB, row address strobe RAS, column address strobe CAS and write enable signals WE, as well as address signals A0 through A15 inclusive, and bank address signals BA0, BA1 and BA2.

As seen in the sectional view of FIG. 6A, a microelectronic element 130 within microelectronic package 100 has element contacts 132 on a face 134 of the microelectronic element 130. The element contacts 132 face corresponding substrate contacts 136 exposed at a surface 120 of a substrate 102 and the element contacts are joined to the substrate contacts. For example, the contacts of the microelectronic element can be joined with the contacts of the substrate in flip-chip manner using a bond metal such as solder, tin, indium, gold, eutectic or other electrically conductive bond metal or bond material. Alternatively, in an appropriate case, another technique can be used such as metal-to-metal joining, e.g., a copper-copper joining process utilizing copper bumps on one or both of the element contacts 132 and corresponding substrate contacts 136.

In the example seen in FIGS. 5-6A, a microelectronic package 100 has columns 104A, 104B of first terminals disposed in the central region 112 of the surface 110 of the substrate 102. As further seen in FIG. 6B, element contacts 132 on the microelectronic element 130 can be disposed at locations within first and second columns 138, 139 each extending in a first direction 142 on the face 134 of the microelectronic element. A column of contacts on the microelectronic element can be fully populated as in the case of column 138, or a column of contacts may only have contacts at some of the positions within the column, as in the case of column 139. As seen in FIGS. 6A-B, an axial plane 140 of the microelectronic element 130 intersects the face 134 of the microelectronic element 130 along a line extending in the first direction 142, and the axial plane 140 also extends in a second direction normal to the face 134 of the microelectronic element. In the case of the microelectronic element 130 seen in FIG. 6B, the axial plane 140 can intersect the face 134 of the microelectronic element at points centered, e.g., equidistant between columns 138, 139 of the element contacts. As further seen in FIG. 6B, as the columns 138, 139 of element contacts are typically not centered precisely between opposed edges 146, 148 of the microelectronic element, the axial plane 140 can be and typically is displaced in a perpendicular direction 143 along the face 134 from a central line 144 that extends in the first direction 142 and is centered precisely between the opposed edges 146, 148. However, in a particular embodiment, when the positions of the columns 138, 139 are so disposed such that the central line 144 is centered between the columns, then the axial plane 140 can coincide with the central line 144.

As further shown in FIG. 6B, the microelectronic element 130 may additionally include a plurality of peripheral contacts adjacent to one or more of the peripheral edges 146, 148. These peripheral contacts may be used for connection to power, ground, or as contacts available for contact with a probing device, such as may be used for testing. In this case, the intersection of the axial plane 140 with the face 134 of the microelectronic element can be centered relative to only columns 138, 139 of contacts which are disposed adjacent to one another near the center of the microelectronic element. The other contacts 192 which are disposed adjacent to one of the edges 146 or 148 of the microelectronic element and which are configured for connection to power, ground, or probing are ignored in determining the location of the intersection of the axial plane 140 with the microelectronic element 130.

Thus, the contacts of the microelectronic element may include the one or more columns of contacts 138, 139 being first contacts and containing a majority of the contacts. The contacts of the microelectronic element may further include second contacts 192 on the face of the microelectronic element disposed adjacent to one or more edges of the face. The second contacts 192 are fewer than the number of first contacts in any one column thereof. In a particular example, each of the second contacts may be configured to be connected to one of a source of power, a ground, or be configured for connection to a probing device. In the completed package 100, these contacts may be without electrical connections with the substrate 102, or in some cases may be electrically connected only to corresponding power or ground conductors on the substrate. In such example, the intersection of the axial plane 140 with the face 134 of the microelectronic element 130 can be centered with respect to the columns of the first contacts, e.g., columns 138, 139 as seen in FIG. 6B, regardless of the positions of the second contacts 192.

Figure 6C:
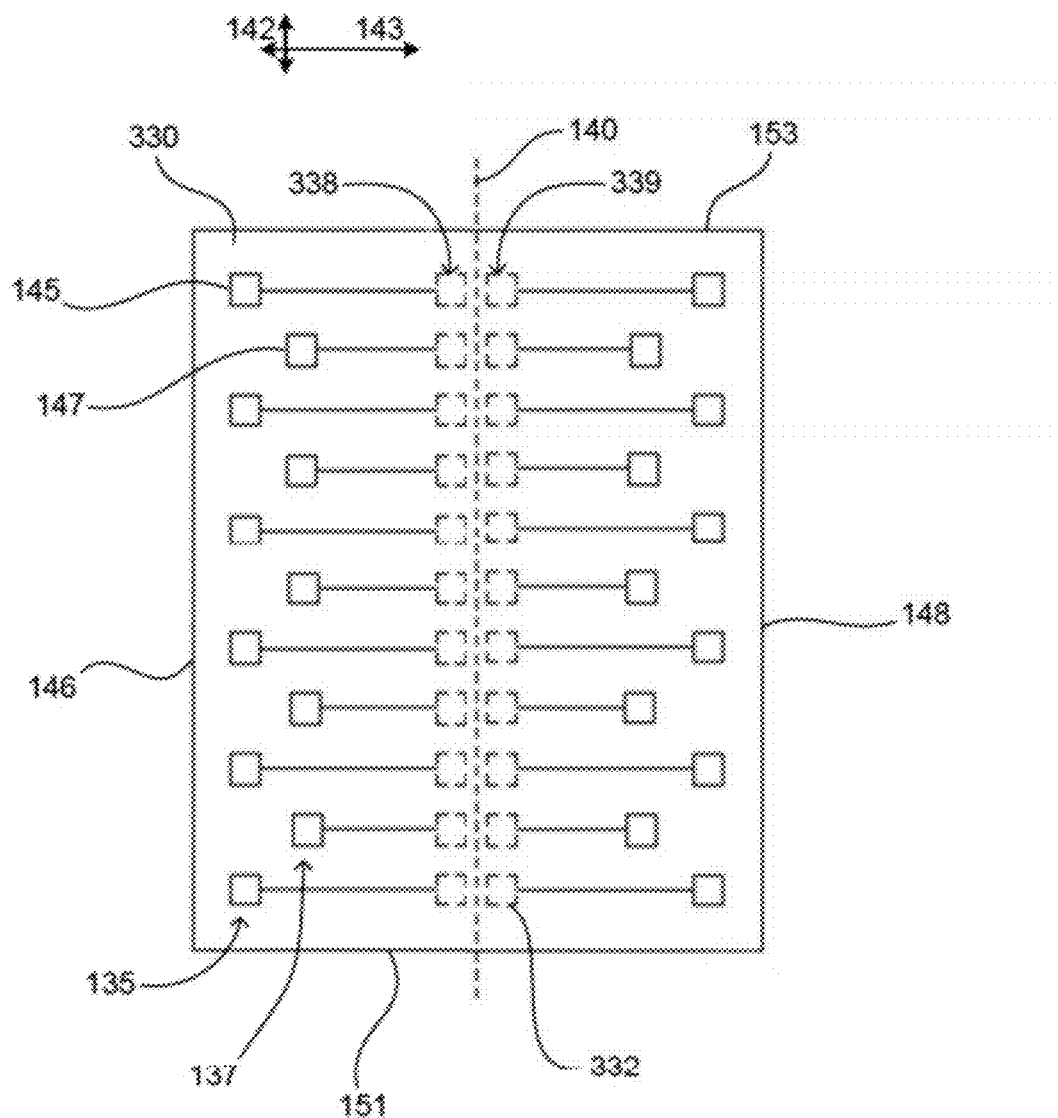
FIG. 6C is a plan view further illustrating a possible arrangement of element contacts and types of contacts on a microelectronic element within a microelectronic package according to any of the embodiments claimed herein, among which is the embodiment shown in FIGS. 5 and 6A.

FIG. 6C illustrates yet another example in which contact pads 332 of a microelectronic element can be disposed in one or two columns 338, 339 near the center of the microelectronic element 330, e.g., adjacent a central axis 140 of the microelectronic element. In this example, the element contacts which are joined to corresponding contacts 136 (FIG. 6A) of the substrate can be redistribution contacts 145, 147 on the microelectronic element. Some or all of the redistribution contacts 145, 147, which are electrically connected with the contact pads 332 can be displaced from the contact pads 332 in one or more directions 142, 143 along a face of the microelectronic element. In one example, the redistribution contacts can be disposed in a plurality of columns 135, 137 which are closer to the edges 146, 148 of the microelectronic element than the columns 338, 339 of contact pads 332. In a particular example, the redistribution contacts can be distributed in an area array exposed at the surface of the microelectronic element. In another particular example, the redistribution contacts can be distributed along one or more peripheral edges 146, 148 of the microelectronic element which extend in a first direction 142, or be distributed along one or more peripheral edges 151, 153 of the microelectronic element which extend in a second direction 143 transverse to direction 142. In yet another example, the redistribution contacts can be distributed along two or more of the peripheral edges 146, 148, 151, 153 of the microelectronic element. In any of these examples, the redistribution contacts 145, 147 can be disposed on the same face of the microelectronic element as the contact pads 332, or be disposed on a face of the microelectronic element opposite from the contact pads. In one example, each contact pad can be connected to a redistribution contact. In another example, there may be no redistribution contact connected to one or more contact pads. Such one or more contact pads 332 which are not connected to a redistribution contact may or may not be electrically connected to one or more corresponding terminals of the package.

Referring to FIG. 6A, the axial plane 140 intersects the central region 112 of the surface 110 of the substrate 102 of the microelectronic package 100. Accordingly, the axial plane intersects the central region 112 of the substrate surface 110 on which the terminals 104A, 104B configured to carry the aforementioned address information, or in a particular implementation, the terminals configured to carry command-address bus information or command-address bus signals, are disposed. Hereinafter, reference to first terminals will be understood to refer to terminals exposed in the central region 112 of the substrate surface, wherein in aggregate, such terminals are configured to carry address information that is usable by circuitry within the microelectronic package to determine an addressable memory location from among all the available addressable memory locations of a memory storage array within a microelectronic element in the microelectronic package, whether the first terminals are configured to carry all or at least a majority, or in one example, three quarters or more of the address information used by circuitry within the package to determine an addressable memory location within such memory storage array. In some embodiments, the first terminals may also be configured to carry additional information or signals as well, such as command information or command signals for write enable, row address strobe and column address strobe function, bank address information, and clock information, as described above.

As further seen in FIG. 6A, joining elements 154A, 154B of a bond metal, e.g., solder, tin, indium or eutectic, or other electrically conductive bond material can be joined to the terminals 104A, 104B, which can be used to join the terminals of the package 100 to a component external to the package, such as to corresponding contacts of a circuit panel.

As further shown in FIG. 7A, in some cases, a microelectronic element 230 may have only one column 238 containing a plurality of contacts on the face 134, in which case the axial plane 240 extends through the column 238 of contacts. As seen in FIG. 7B, as incorporated in microelectronic package 200, the axial plane 240 may intersect the central region 112 of the substrate surface at a location between columns 104A, 104B of terminals, wherein the axial plane 240 and each of the columns 104A, 104B extend in a first direction 142 in which a column 238 of the contacts of the microelectronic element extend. Alternatively, in another example (not shown) the axial plane 240 may intersect the central region 112 along a line extending in the first direction, wherein the line intersects one of the columns 104A or 104B of the terminals.

As further seen in FIG. 7B, a minimum pitch 150 exists as the smallest distance between any two adjacent columns of terminals on the substrate. The minimum pitch is defined as the minimum distance between centerlines extending in the direction 162 through the respective adjacent columns.

The minimum pitch is in a direction 143 perpendicular to the direction 142 in which the terminals in a particular column, e.g., column 104A are arranged. In the example shown in FIG. 7B, the minimum pitch occurs between columns 104A, 104B which are closest to one another between edges 116 and 118 of the substrate 110. With further reference to FIG. 7B, the central region 112 has a maximum width 152 along the substrate surface 110 in the direction 143 of the pitch, i.e., in a second direction transverse to the first direction 142, the width 152 being not greater than three and one-half times the minimum pitch between any two adjacent columns of the terminals, e.g., columns 104A, 104B of the terminals.

Figure 7C:
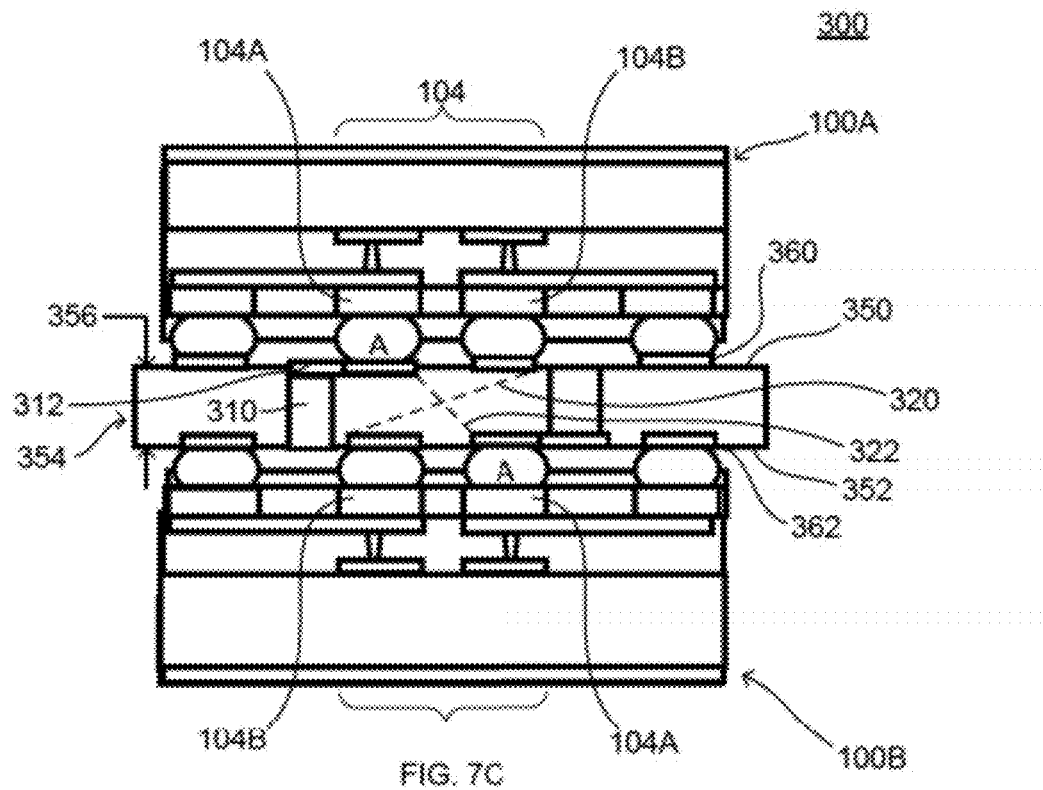
FIG. 7C is a sectional view illustrating a microelectronic assembly and first and second microelectronic packages electrically interconnected therewith in accordance with an embodiment of the invention.

FIG. 7C illustrates a microelectronic assembly 300 of first and second microelectronic packages 100A, 100B, each being a microelectronic package 100 as described with reference to FIGS. 5-6B above, as mounted to opposite first and second surfaces 350, 352 of a circuit panel 354. The circuit panel can be of various types, such as a printed circuit board used in a dual inline memory module ("DIMM") module, a circuit board or panel to be connected with other components in a system, or a motherboard, among others. The circuit panel has contacts configured to electrically connect to microelectronic packages. In a particular embodiment, the circuit panel may include an element having a coefficient of thermal expansion ("CTE") of less than 12 parts per million per degree Celsius ("ppm/° C."), wherein the panel contacts at the first and second surfaces are connected by vias extending through the element. For example, the element may consist essentially of semiconductor, glass, ceramic or liquid crystal polymer material.

The first and second microelectronic packages 100A, 100B can be mounted to corresponding panel contacts 360, 362 exposed at the first and second surfaces 350, 352 of the circuit panel 354. In the example shown in FIG. 7C, the first terminals 104A, 104B can be disposed at locations in a grid 104 on the first package 100A. The first terminals 104A, 104B of the second package 100B can also be disposed at locations within a grid 104 on the second package. Each grid of terminals may be fully populated, i.e., there being a terminal occupying each position of each grid. Alternatively, one or more positions of each grid may not be occupied by a terminal. As evident from FIG. 7C, the grids can be aligned within one ball pitch of one another in x and y orthogonal directions parallel to the surface 350 of the circuit panel, the ball pitch being no greater than a minimum pitch between any two adjacent parallel columns of the terminals on either package. In a particular example, at least half of the positions of the grids of the first and second packages may be aligned with one another in x and y orthogonal directions parallel to the first surface of the circuit panel.

In a particular example, the grids may be aligned with one another in the x and y directions such that at least some of the first terminals on the first and second microelectronic packages are coincident with one another. As used herein, when the first terminals of packages at opposite surfaces of a circuit panel are "coincident" with one another, the alignment can be within customary manufacturing tolerances or can be within a tolerance of less than one-half of one ball pitch of one another in x and y orthogonal directions parallel to the first and second circuit panel surfaces, the ball pitch being as described above.

Wiring within the circuit panel 354 electrically connects the terminals 104A of package 100A with terminals 104A of package 100B, as shown. The wiring that forms the electrical connections is shown schematically by the dashed line 320 in FIG. 7C, because the wiring can be hidden from the particular view provided in FIG. 7C. Similarly, wiring within the circuit panel 354 electrically connects the terminals 104B of package 100A with terminals 104B of package 100B, and the electrical interconnections between such terminals is shown schematically by the dashed line 322 in FIG. 7C.

Further, in a particular example as shown in FIG. 7C, when there are two columns of first terminals 104A, 104B in each grid, and the grids are aligned within at least one ball pitch of one another, then the wiring on the circuit panel 354 required to connect one of the first terminals labeled "A" of package 100A with one of the first terminals labeled "A" of package 100B can be relatively short. Specifically, when each grid 104 on each package has two columns 104A, 104B, and the grids 104 are aligned in the above-described manner, then the first column 104A of the first package 100A is aligned within one ball pitch of the second column 104B of the second package in x and y orthogonal directions parallel to the first surface 350 of the circuit panel, and the second column 104B of the first package 100A is aligned within one ball pitch of the first column 104A of the second package in x and y orthogonal directions parallel to the first surface 350 of the circuit panel.

Therefore, the electrical lengths of stubs on the circuit panel 354 which electrically connect a first terminal 104A of the first package 100A with the corresponding first terminal 104A on the second package 100B can be less than seven times a minimum pitch of the first terminals on each package, for example, less than seven times the pitch 150 between columns 104A, 104B of first terminals in FIG. 7B. Stated another way, the total combined length of the conductive elements connecting a pair of electrically coupled first and second panel contacts exposed at the first and second surfaces of the circuit panel, for electrically interconnecting the first and second panel contacts with a corresponding conductor of a bus on the circuit panel can be less than seven times a minimum pitch of the panel contacts, for example. Moreover, the length of a stub of at least one of the electrical connections between one of the first terminals of the first microelectronic package and a corresponding one of the first terminals of the second microelectronic package can be less than seven times a minimum pitch of the first terminals on the first microelectronic package. In a particular embodiment when the first terminals are configured to carry the aforementioned command-address bus signals, the total combined length of the conductive elements connecting a pair of electrically coupled first and second panel contacts exposed at the first and second surfaces of the circuit panel for electrically interconnecting the first and second panel contacts with one of the corresponding command-address bus signals on the circuit panel can be less than seven times a smallest pitch of the panel contacts. In yet another example, the electrical length of the connection between a first terminal 104A of the first package 100A with the corresponding first terminal 104A on the second package 100B may be approximately the same as a thickness 356 of the circuit panel 354 between first and second surfaces 350, 352.

The reductions in the lengths of these electrical connections can reduce stub lengths in the circuit panel and the assembly, which can help improve the electrical performance, such as reducing settling time, ringing, jitter, or intersymbol interference, among others, for the above-noted signals which are carried by the first terminals and which are transferred to microelectronic elements in both the first and second packages.

Moreover, it may be possible to obtain other benefits as well, such as simplifying the structure of the circuit panel or reducing the complexity and cost of designing or manufacturing the circuit panel. That is, connections on the circuit panel may require fewer layers of wiring to interconnect the first terminals of each package to the bus on the circuit panel, such as the above-discussed bus which carries address information or a command-address bus.

Figure 7D:
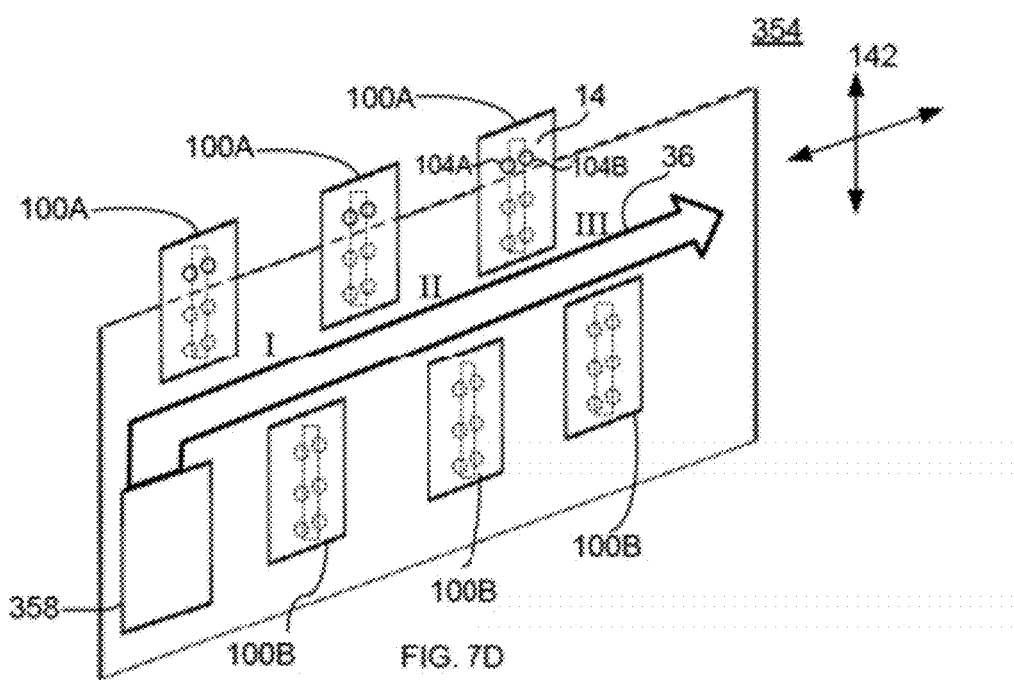
FIG. 7D is a schematic diagram illustrating a microelectronic assembly including a circuit panel and microelectronic packages electrically connected thereto, e.g., a memory module, among others, according to an embodiment of the invention.

In addition, the number of global routing layers of conductors, i.e., wiring extending in at least one direction generally parallel to a surface of the circuit panel, which is required to route signals from the above-noted signals carried by the first terminals, e.g., address information or command-address bus signals can sometimes be reduced. For example, the number of such global routing layers between a connection site where a first pair of microelectronic packages 100A, 100B is connected and a different connection site where at least one other microelectronic package is connected, e.g., between connection sites II and III (FIG. 7D) thereon, can be reduced when the microelectronic packages attached thereto are constructed according to the principles herein. Specifically, the number of global routing layers required to route such signals along the circuit panel may in some cases be reduced to two or fewer routing layers. In a particular example, there may be no more than one routing layer for global routing of all of the above-noted address or command-address bus signals between a connection site at which first and second microelectronic packages are connected, and a different connection site at which at least a third microelectronic package 100A or 100B is electrically connected. However, on the circuit panel, there may be a greater number of global routing layers used to carry signals other than the above-noted address or command-address bus signals. FIG. 7D illustrates a microelectronic assembly such as, for example, a DIMM, among others, incorporating a circuit panel and a plurality of microelectronic packages mounted opposite one another to first and second opposite surfaces thereof. As seen in FIG. 7D, the above-noted address signals or command-address bus signals can be routed on a bus 36, e.g., an address bus or command-address bus on the circuit panel or circuit board 354 in at least one direction 143 between connection sites I, II or III at which respective pairs of microelectronic packages 100A, 110B are connected to opposite sides of the circuit panel. Signals of such bus 36 reach each pair of packages at the respective connection sites I, II or III at slightly different times. The at least one direction 143 can be transverse or orthogonal to a direction 142 in which at least one column 138 of a plurality of contacts on at least one microelectronic element within each package 100A or 100B extends. In such way, the signal conductors of the bus 36 on (i.e., on or within) the circuit panel 354 can in some cases be spaced apart from one another in a direction 142 which is parallel to the at least one column 138 of contacts on a microelectronic element within a package 100A, or 100B connected to the circuit panel. Such configuration, particularly when the first terminals 104A, 104B of each microelectronic package are disposed at positions within one or more columns extending in such direction 142, may help simplify the routing of signal conductors of one or more global routing layers on the circuit panel used to route the signals of the bus 36. For example, it may be possible to simplify routing of the command-address bus signals on a circuit panel when relatively few first terminals are disposed at the same vertical layout position on each package. Thus, in the example shown in FIG. 5, only two first terminals are disposed at the same vertical layout position on each package, such as the first terminals configured to receive address signals A3 and A1.

Figure 19:
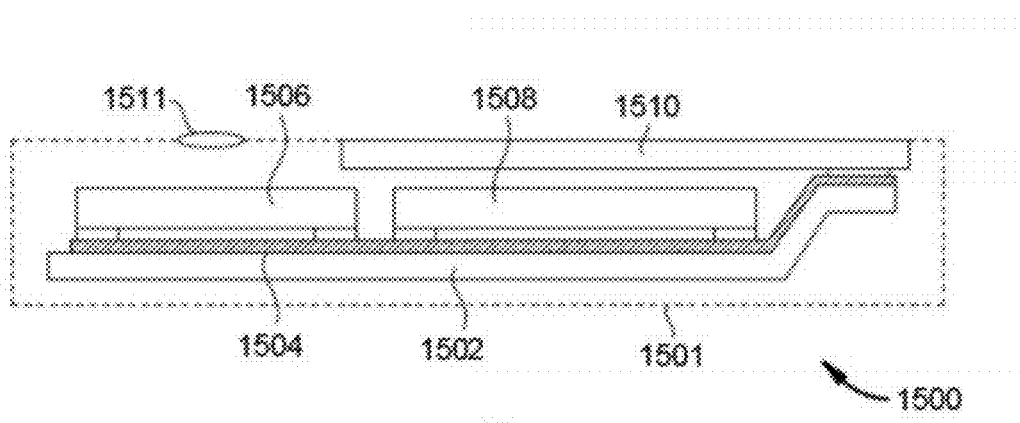
FIG. 19 is a schematic sectional view illustrating a system according to an embodiment of the invention.

In an exemplary embodiment, the microelectronic assembly 354 can have a second microelectronic element 358 that can include a semiconductor chip configured to perform buffering of at least some signals transferred to the microelectronic packages 100A, 100B of the assembly 354. In a particular embodiment, the second microelectronic element can be configured predominantly to perform a logic function, such as a solid state drive controller, and one or more of the microelectronic elements 358 in the microelectronic packages 100A and 100B can each include memory storage elements such as nonvolatile flash memory. In one example, the second microelectronic element 358 can include a special purpose processor that is configured to relieve a central processing unit of a system such as the system 1500 (FIG. 19) from supervision of transfers of data to and from the memory storage elements included in the microelectronic elements 130. Such a microelectronic element 358 including a solid state drive controller can provide direct memory access to and from a data bus on a motherboard (e.g., the circuit panel 1502 shown in FIG. 19) of a system such as the system 1500. In a particular embodiment, the microelectronic element 358 can have a buffering function. Such a microelectronic element 358 can be configured to help provide impedance isolation for each of the microelectronic elements 130 in microelectronic packages 100A, 100B with respect to components external to the microelectronic assembly 354 or system 1500 (FIG. 19).

In a particular embodiment, the first terminals 104 of the microelectronic package can be configured to carry information that controls an operating mode of the microelectronic element 101. More specifically, the first terminals can be configured to carry all of a particular set of command signals and/or clock signals transferred to the microelectronic package 100. In one embodiment, the first terminals 104 can be configured to carry all of the command signals, address signals, bank address signals, and clock signals transferred to the microelectronic package 100 from an external component, wherein the command signals include row address strobe, column address strobe and write enable. In such embodiment, the first chip can be configured to regenerate the information that controls the operating mode. Alternatively, or in addition thereto, the first chip can be configured to partially or fully decode the information that controls the operating mode of the microelectronic element. In such embodiment, each second chip may or may not be configured to fully decode one or more of address information, command information, or information that controls an operating mode of the microelectronic element.

Figure 8:
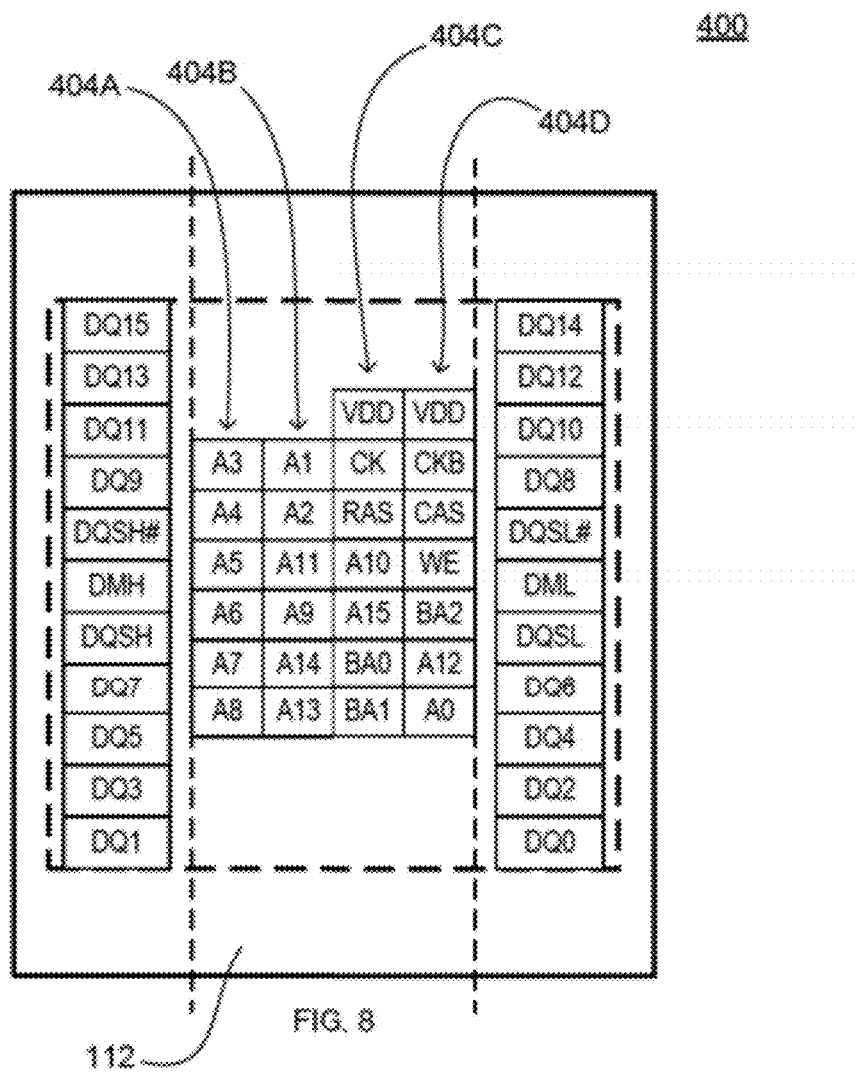
FIG. 8 is a plan view illustrating an alternative arrangement of terminals on a microelectronic package according to a variation of the embodiment shown in FIGS. 5 and 6A.

Microelectronic packages having other arrangements of terminals thereon can be provided. For example, in the microelectronic package 400 illustrated in FIG. 8, four columns 404A, 404B, 404C, and 404D of terminals are disposed in a central region 112 of the substrate surface, these columns containing the first terminals which are configured to carry all of the command signals, address signals, bank address signals and clock signals used to sample the address signals. In another example (not shown), it is also possible for the first terminals of a microelectronic package to be disposed at positions within three columns.

Figure 9A:
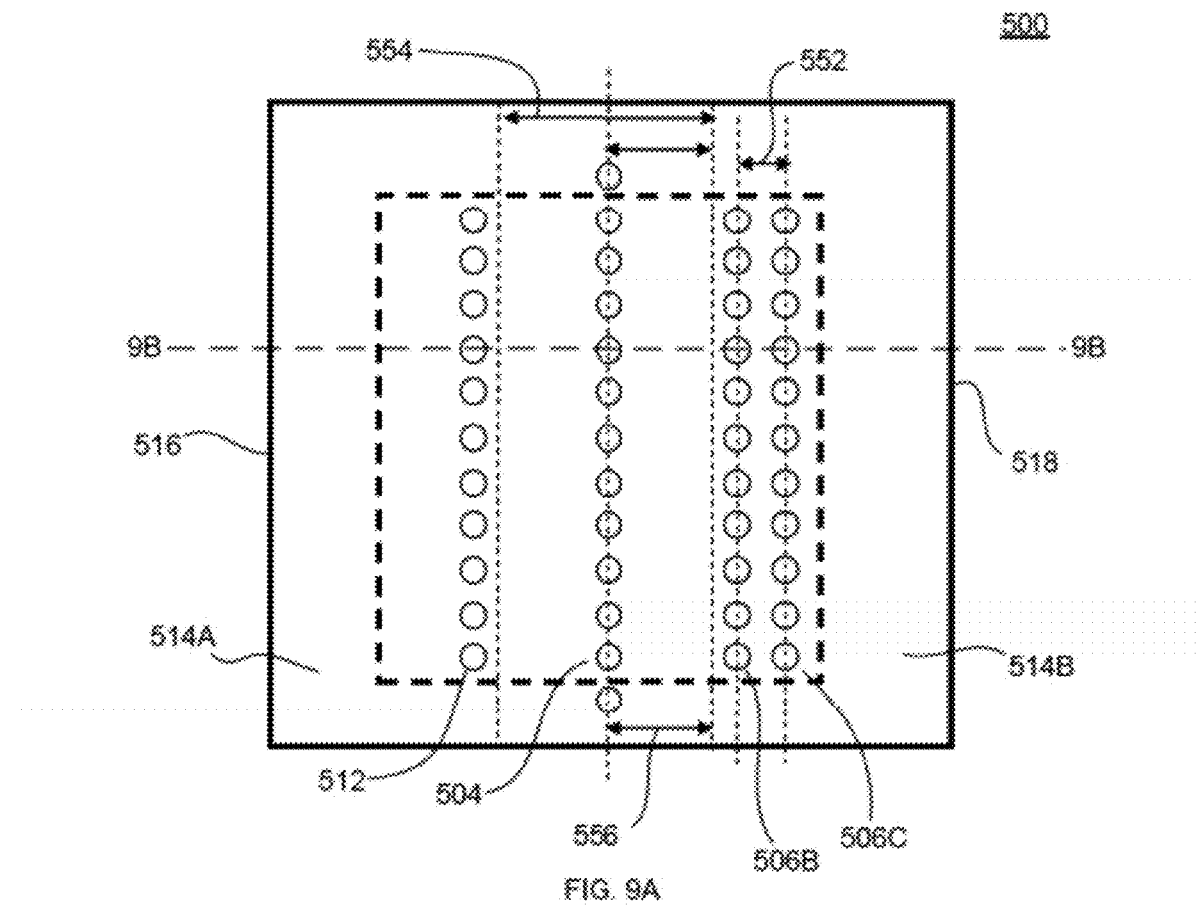
FIG. 9A is a plan view and FIG. 9B is a corresponding sectional view through line 9B-9B of FIG. 9A illustrating a microelectronic package according to a variation of the embodiment shown in FIGS. 5 and 6A.
Figure 9B:
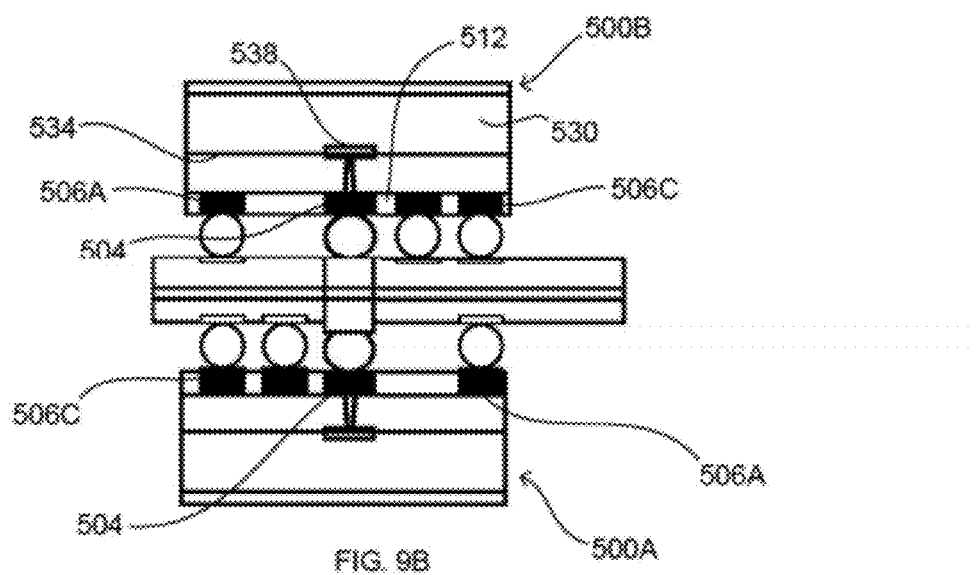

In the microelectronic package 500 illustrated in FIGS. 9A and 9B, the first terminals are disposed at positions within a single column 504 disposed in the central region 512 of the substrate surface, the single column extending in a direction parallel to the edges 516, 518 of the microelectronic package. Although shown in FIG. 9A, the second terminals are omitted from FIG. 9B for clarity.

In the particular example seen in FIG. 9A, the minimum pitch between any two columns of terminals on the substrate is the pitch 552 between the adjacent columns 506B and 506C of second terminals disposed in peripheral region 514B of the substrate surface. The width 554 of the central region is not greater than three and one-half times the minimum pitch 552 between the columns 506B and 506C of terminals.

Figure 9C:
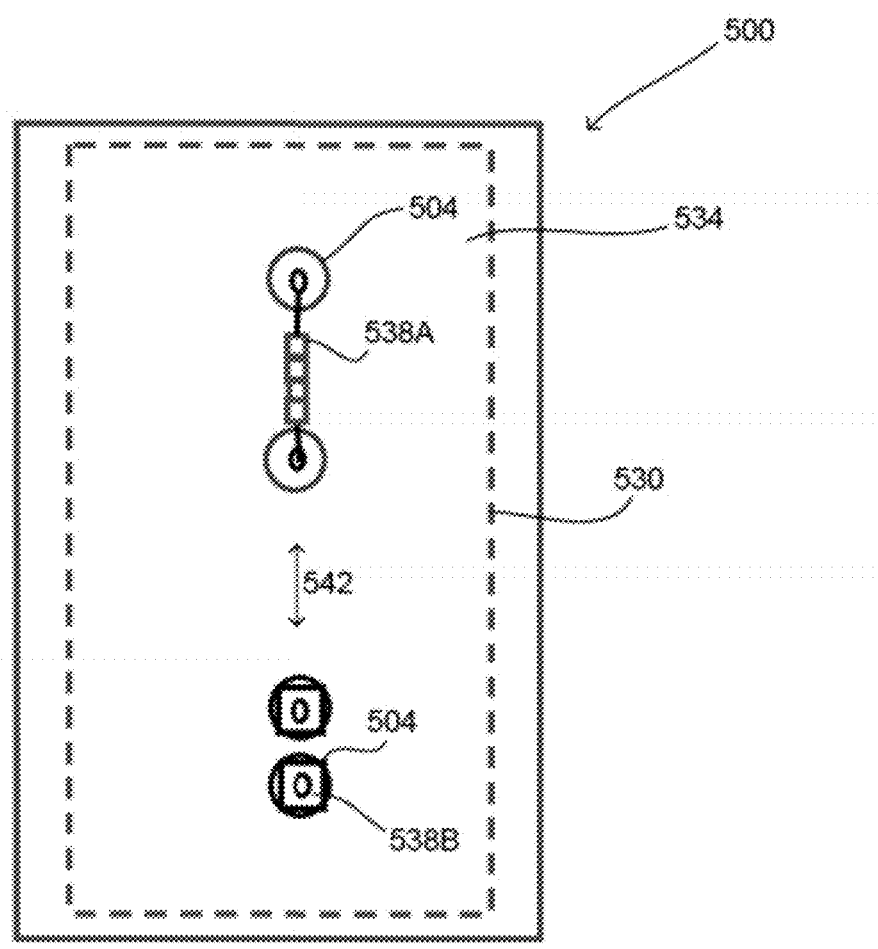
FIG. 9C is a plan view illustrating an arrangement of element contacts and electrical interconnection between a microelectronic element and a substrate in an embodiment of a microelectronic package as shown in FIGS. 9A-B.

As further seen in FIG. 9B, the microelectronic element 530 in microelectronic package 500 may have a single column of element contacts 538 on the face 534 of the microelectronic element. In such case, the internal electrical connections between the element contacts 538 and the terminals 504 of the microelectronic package 500 can be particularly short. For example, in the microelectronic package 500 seen in FIG. 9C, connections between element contacts 538A and the terminals 504 may in one case extend only or mainly in a first direction 542 in which the column 538A of element contacts extend on the face 534 of the microelectronic element 530. In another case, the connections between element contacts 538B and the terminals 504 may in one case extend only in a vertical direction above the contacts 538B, so that at least some terminals 504 of the package 500 may at least partially overlie the element contacts 538 to which the contacts 538B are electrically connected.

Figure 10:
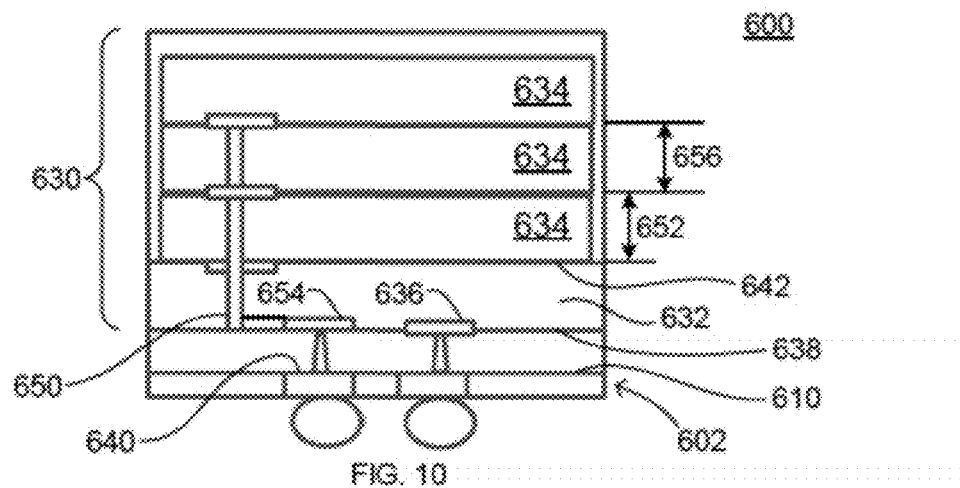
FIG. 10 is a sectional view illustrating a microelectronic package including a stacked electrically connected assembly of semiconductor chips therein in accordance with an embodiment of the invention.

FIG. 10 illustrates a microelectronic package 600 according to a particular example in which the microelectronic element 630 includes a plurality of vertically stacked electrically interconnected semiconductor chips 632 and 634. In this case, the microelectronic element 630 includes a first semiconductor chip 632 having element contacts 636 on a face 638 thereof which face substrate contacts 640 on a first surface 610 of the substrate and are joined to the substrate contacts 640. The microelectronic element also includes one or more second semiconductor chips 634 which overlie a face 642 of the first semiconductor chip 632 opposite the face 638 of the first semiconductor chip, the face 642 being remote from the first surface 610 of the substrate 602. The one or more second semiconductor chips 634 are electrically interconnected with the first semiconductor chip 632. For example, as seen in FIG. 10, there are three vertically stacked second semiconductor chips 634 in which the faces thereof overlie one another.

In the microelectronic package 600 seen in FIG. 10, each of the first and second semiconductor chips 632, 634 can be configured such that each such semiconductor chip embodies a greater number of active devices to provide memory storage array function than any other function. For example, each of the first and second semiconductor chips may include a memory storage array and all circuitry required for inputting data to and outputting data from the memory storage array. For example, when the memory storage array in each semiconductor chip is writable, each of the semiconductor chips may include circuitry configured to receive external data input from terminals of the package, as well as circuitry configured to transfer data output from such semiconductor chip to terminals of the package. Thus, each first and each second semiconductor chip 632, 634 can be a dynamic random access memory ("DRAM") chip or other memory chip which is capable of inputting and outputting data from the memory storage array within such semiconductor chip and receiving and transmitting such data to a component external to the microelectronic package. Stated another way, in such case, signals to and from the memory storage array within each DRAM chip or other memory chip does not require buffering by an additional semiconductor chip within the microelectronic package.

Alternatively, in another example, the one or more second semiconductor chips 634 may embody a greater number of active devices to provide memory storage array function than any other function, but the first semiconductor chip 632 may be a different type of chip. In this case, the first semiconductor chip 632 can be configured, e.g., designed, constructed, or set up, to buffer signals, i.e., regenerate signals received at the terminals for transfer to the one or more second semiconductor chips 634, or to regenerate signals received from one or more of the second semiconductor chips 634 for transfer to the terminals, or to regenerate signals being transferred in both directions from the terminals to the one or more second semiconductor chips 634; and from the one or more semiconductor chips to the terminals of the microelectronic package.

Alternatively or in addition to regenerating signals as described above, in one example, the first chip in such a composite microelectronic element can be configured to partially or fully decode the information that controls the operating mode of the microelectronic element. In a particular example, the first semiconductor chip in such composite microelectronic element can be configured to partially or fully decode at least one of address information or command information received at the terminals, such as at the first terminals. The first chip can then output the result of such partial or full decoding for transfer to the one or more second semiconductor chips 634.

In a particular example, the first semiconductor chip can be configured to buffer the address information, or in one example, the command signals, address signals and clock signals which are transferred to the one or more second semiconductor chips. For example, the first semiconductor chip 632 can be a buffer chip which embodies a greater number of active devices to provide a buffering function in transferring signals to other devices, e.g., to the one or more second semiconductor chips 634, than for any other function. Then, the one or more second semiconductor chips may be reduced function chips which have memory storage arrays but which can omit circuitry common to DRAM chips, such as buffer circuitry, decoders or predecoders or wordline drivers, among others. In that case, the first chip 632 may function as a "master" chip in the stack and to control operations in each of the second semiconductor chips 634. In a particular example, the second semiconductor chips may be configured such that they are not capable of performing the buffering function. In that case, the stacked arrangement of the first and second semiconductor chips is configured such that the buffering function required in the microelectronic package can be performed by the first semiconductor chip, and cannot be performed by any of the second semiconductor chips in the stacked arrangement.

In any of the embodiments described herein, the one or more second semiconductor chips can be implemented in one or more of the following technologies: DRAM, NAND flash memory, RRAM ("resistive RAM" or "resistive random access memory"), phase-change memory ("PCM"), magnetoresistive random access memory, e.g. such as may embodiment tunnel junction devices, spin-torque RAM, or content-addressable memory, among others.

FIG. 10 further illustrates a microelectronic package 600 according to a particular example in which the one or more second semiconductor chips 634 is electrically connected with the first semiconductor chip 632 by through silicon vias ("TSVs") 650 which extend in a direction of a thickness 652 of the first semiconductor chip 632 between first and second opposed faces 638, 642 thereof. As seen in FIG. 10, in one example, the TSVs 650 can be electrically connected with the element contacts 636 of the first semiconductor chip 632, such as by traces 654 extending along a face 638 of the first semiconductor chip 632. Although any electrical connections between the first and second semiconductor chips can be made in this manner, such connections are well-suited for the distribution of power and ground to the first and second semiconductor chips.

Signals which are regenerated by a first semiconductor chip 632 operating as a buffer element, which are then transferred to the one or more second semiconductor chips, can be routed through TSVs connected to internal circuitry, for example. As further seen in FIG. 10, the microelectronic package may also include through-silicon-vias 650 extending partially or completely through one or more of the second semiconductor chips 634. TSVs 650 may not directly connect to the substrate 602, but may instead terminate on circuitry contained in semiconductor chip 632.

Figure 11A:
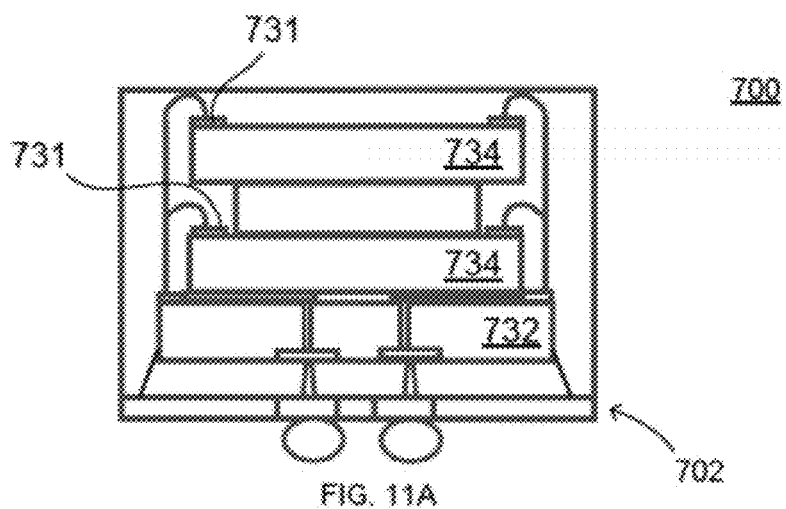
FIG. 11A is a sectional view illustrating a microelectronic package including a stacked electrically connected assembly of semiconductor chips therein in accordance with an embodiment of the invention.

FIG. 11A further illustrates microelectronic package 700 according to a variation of the embodiment seen in FIG. 10. In this case, the first semiconductor chip 732 is interconnected with the substrate 702 in the same manner as described above relative to FIG. 10. However, the one or more second semiconductor chips 734 is electrically interconnected with the first semiconductor chip 732 through wire bonds.

Figure 11B:
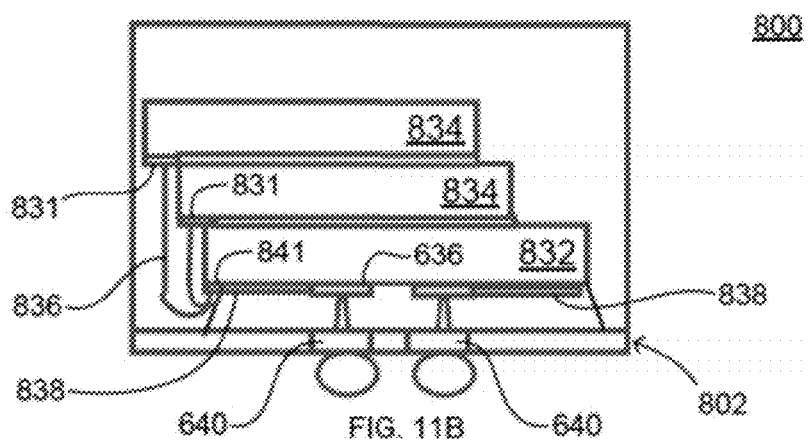
FIG. 11B is a sectional view illustrating a microelectronic package including a stacked electrically connected assembly of semiconductor chips therein in accordance with an embodiment of the invention.

In the example shown in FIG. 11A, the second semiconductor chips 734 are placed with their front faces and contacts 731 thereon facing upwardly, that is, facing away from the first semiconductor chip 732. However, in another variation seen in FIG. 11B, another way the first and second semiconductor chips 832, 834 can be mounted together in the microelectronic package is for each of the second semiconductor chips 834 to be placed with their front faces and contacts 831 facing downwardly, that is, towards the substrate 602. In that way, the contacts 831 can be electrically connected to corresponding contacts 841 on the front face 838 of the first semiconductor chip 832 through wire bonds 836. In this case, the contacts 841 can be electrically connected to the element contacts 636 on the first semiconductor chip 832 such as by traces 838 extending along the front face 838 of the first semiconductor chip 832, with the connections between the element contacts 636 and the terminals 640 being as described above relative to FIG. 10.

Figure 12:
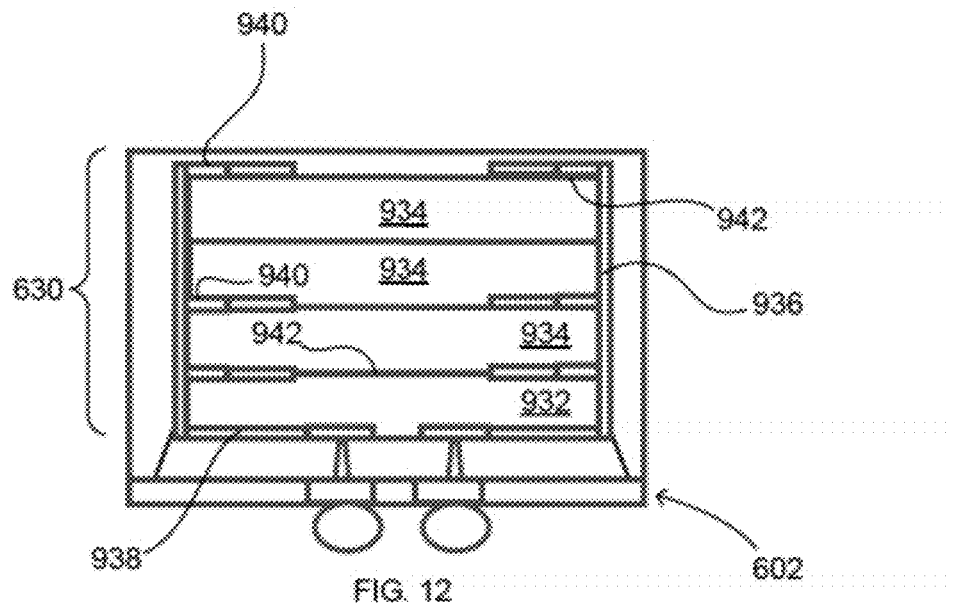
FIG. 12 is a sectional view illustrating a microelectronic package including a stacked electrically connected assembly of semiconductor chips therein in accordance with an embodiment of the invention.

FIG. 12 illustrates a microelectronic package according to a further variation of the embodiment described above relative to FIG. 10, in which connections between contacts of the one or more second semiconductor chips 934 and the first semiconductor chip 932 can include traces 936 which extend along one or more edges of the microelectronic element 930, i.e., along edges of the semiconductor chips 932, 934 within the microelectronic element. The electrical connections between the semiconductor chips 932, 934 may further include traces 938, 940 which extend along front faces of the first semiconductor chip 932 and the second semiconductor chips 934, respectively. As further shown in FIG. 12, the front faces 942 of the second semiconductor chips may face upwardly away from the substrate 602 or downwardly towards the substrate 602. Once again, as in the above-described structures (FIGS. 10-11A) TSVs within the first semiconductor chip 932 may extend partially or completely through a thickness of the first semiconductor chip 932, or some of the TSVs in the first semiconductor chip 932 may extend partially its thickness while others of the TSVs extend completely through the thickness of the first semiconductor chip 932.

Figure 13A:
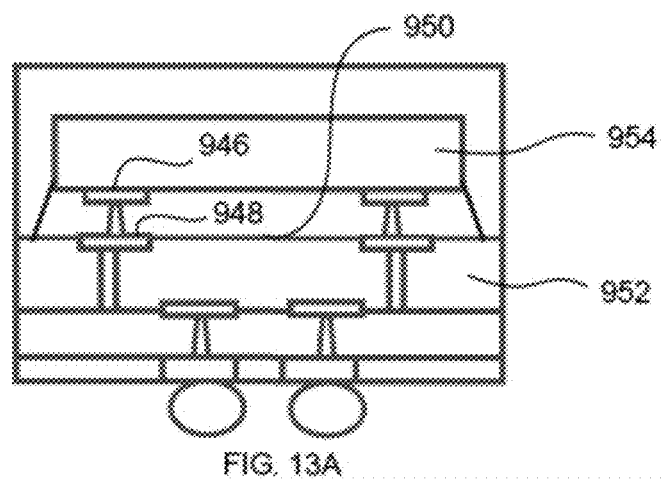
FIG. 13A is a sectional view illustrating a microelectronic package including a stacked electrically connected assembly of semiconductor chips therein in accordance with an embodiment of the invention.

FIG. 13A illustrates a microelectronic package according to yet another variation of the embodiment described above relative to FIG. 10, in which a second semiconductor chip 954 has contacts 946 facing corresponding contacts 948 on a face 950 of the first semiconductor chip 952, the contacts 946, 948 being joined together such as through a metal, bond metal or other electrically conductive material, so as to form a flip-chip connection between the first and second semiconductor chips 952, 954.

Figure 13B:
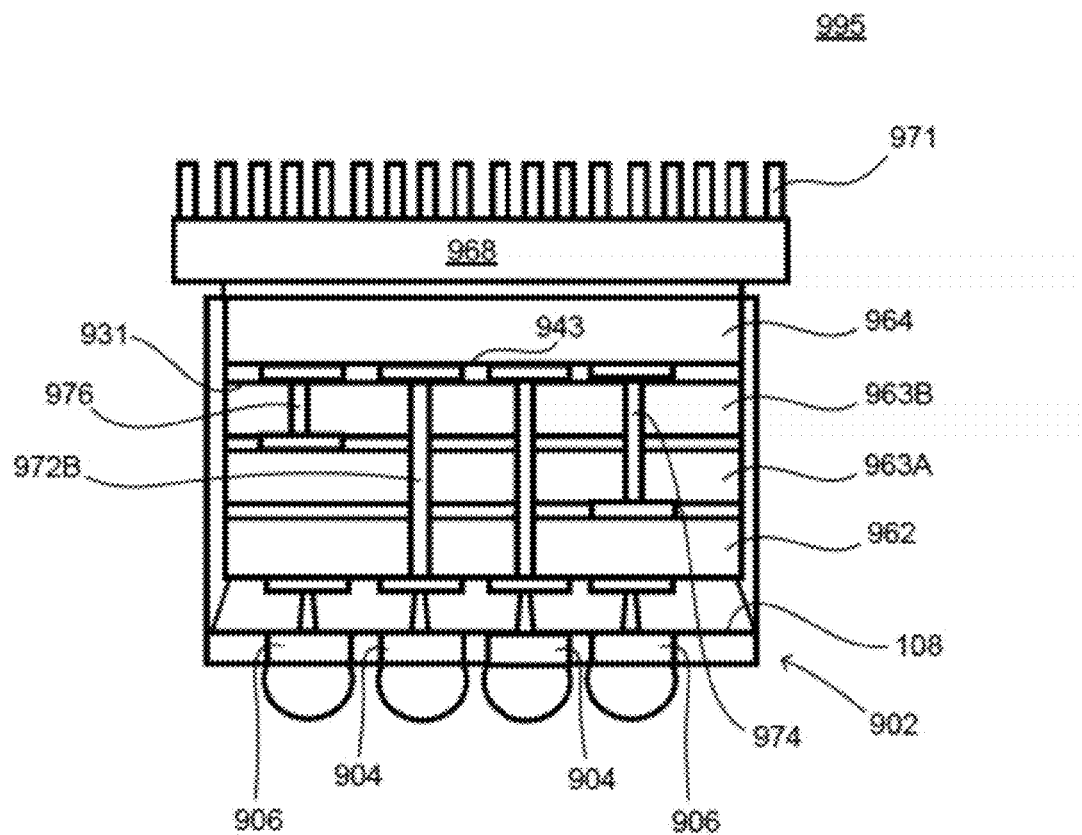
FIG. 13B is a sectional view illustrating a microelectronic package including a stacked electrically connected assembly of semiconductor chips therein in accordance with an embodiment of the invention.

FIG. 13B illustrates a variation of the microelectronic package shown in FIG. 13A. Unlike the package shown in FIG. 13A, semiconductor chip 964, which can be configured to regenerate or at least partially decode address information or other information, e.g., regenerate signals for transfer to other semiconductor chips in the package, is not located adjacent to the first surface 108 of the substrate 902. Rather, in this case, the semiconductor chip 964 can be disposed at a position within the package that overlies one or more other semiconductor chips. For example, as shown in FIG. 13B, the chip 964 at least partially overlies the semiconductor chip 962 that is disposed adjacent to the first surface 108 of the substrate 902 and at least partially overlies semiconductor chips 963A and 963B which are disposed atop semiconductor chip 962 or otherwise at least partially overlie semiconductor chip 962.

In one example, the semiconductor chips 962, 963A, and 963B may include memory storage arrays. As in the examples described above, such chips 962, 963A, and 963B may each incorporate circuits configured to buffer, e.g., temporarily store, data that is to be written to such chip, or data that is being read from such chip, or both. Alternatively, the chips 962, 963A, and 963B may be more limited in function and may need to be used together with at least one other chip that is configured to temporarily store data that is to be written to such chip or data that is being read from such chip, or both.

The semiconductor chip 964 can be electrically connected to terminals of the microelectronic package, e.g., to grids in which the first terminals 904 and the second terminals 906 are disposed, through electrically conductive structure, e.g., TSVs 972a and 972b (collectively TSVs 972), that connect to contacts exposed at the first surface 108 of the substrate 902. The electrically conductive structure, e.g., the TSVs 972, can electrically connect to the semiconductor chip 964 through contacts 938 on the chip 964 and through conductors (not shown) that extend along the face 943 of the chip 964, or along a confronting face 931 of the chip 963A, or along the faces 931, 943 of both of the chips 963A, 964. As indicated above, the semiconductor chip 964 may be configured to regenerate or at least partially decode signals or information that it receives through the conductive structure, e.g., the TSVs 972 such as TSVs 972a and 972b, and it may be configured to transfer the regenerated or at least partially decoded signals or information to other chips within the package such as to the chips 962, 963A, and 963B.

As further seen in FIG. 13B, the semiconductor chips 962, 963A, and 963B can be electrically connected to the semiconductor chip 964 and to one another by a plurality of through-silicon vias ("TSVs") 972, 974, and 976 that can extend through one, two, or three or more of such chips. Each such TSV may electrically connect with wiring within the package, e.g., conductive pads or traces of two or more of the semiconductor chips 962, 963A, 963B, and 964. In a particular example, signals or information can be transferred from the substrate 902 to the chip 964 along a first subset of TSVs 972a, and signals or information can be transferred from the chip 964 to the substrate along a second subset of TSVs 972b. In one embodiment, at least a portion of the TSVs 972 can be configured to have signals or information be transferred in either direction between the chip 964 and the substrate 902, depending on the particular signals or information. In one example (not shown), through silicon vias may extend through the thicknesses of all semiconductor chips 962, 963A, and 963B, even though each through silicon via may not electrically connect with each such semiconductor chip through which it extends.

As further seen in FIG. 13B, a heat sink or heat spreader 968, which may include a plurality of fins 971, can be thermally coupled to a face of the semiconductor chip 964, e.g., a rear face 933 thereof, such as through a thermally conductive material 969 such as thermal adhesive, thermally conductive grease, or solder, among others.

The microelectronic assembly 995 shown in FIG. 13B may be configured to operate as a memory module capable of transferring a designated number of data bits per cycle onto or off of the microelectronic package through the first and second terminals provided therefor on the substrate. For example, the microelectronic assembly may be configured to transfer a number of data bits such as thirty-two data bits, sixty-four data bits, or ninety-six data bits, among other possible configurations, to or from an external component such as a circuit panel that can be electrically connected with the first terminals 904 and second terminals 906. In another example, when the bits transferred to and from the package include error correction code bits, the number of bits transferred per cycle to or from the package may be a different number such as thirty-six bits, seventy-two bits, or one-hundred-eight bits, for example. Other data widths are possible other than those that are specifically described here.

Figure 14:
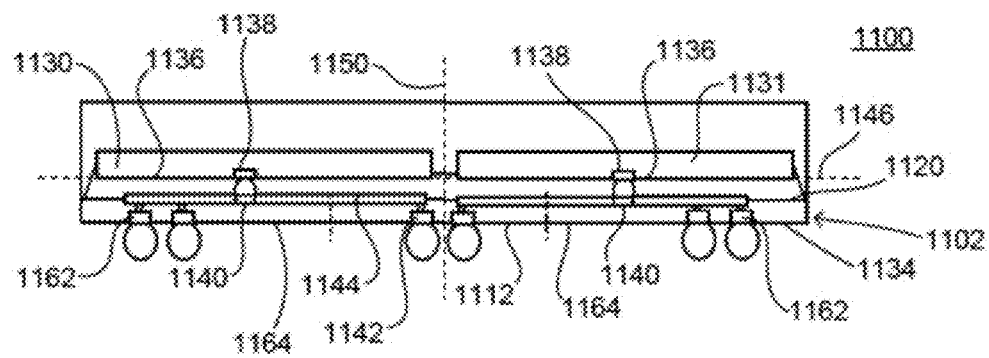
FIG. 14 is a sectional view illustrating an embodiment of a microelectronic package including first and second microelectronic elements therein each having element contacts facing and joined to corresponding substrate contacts.
Figure 15A:
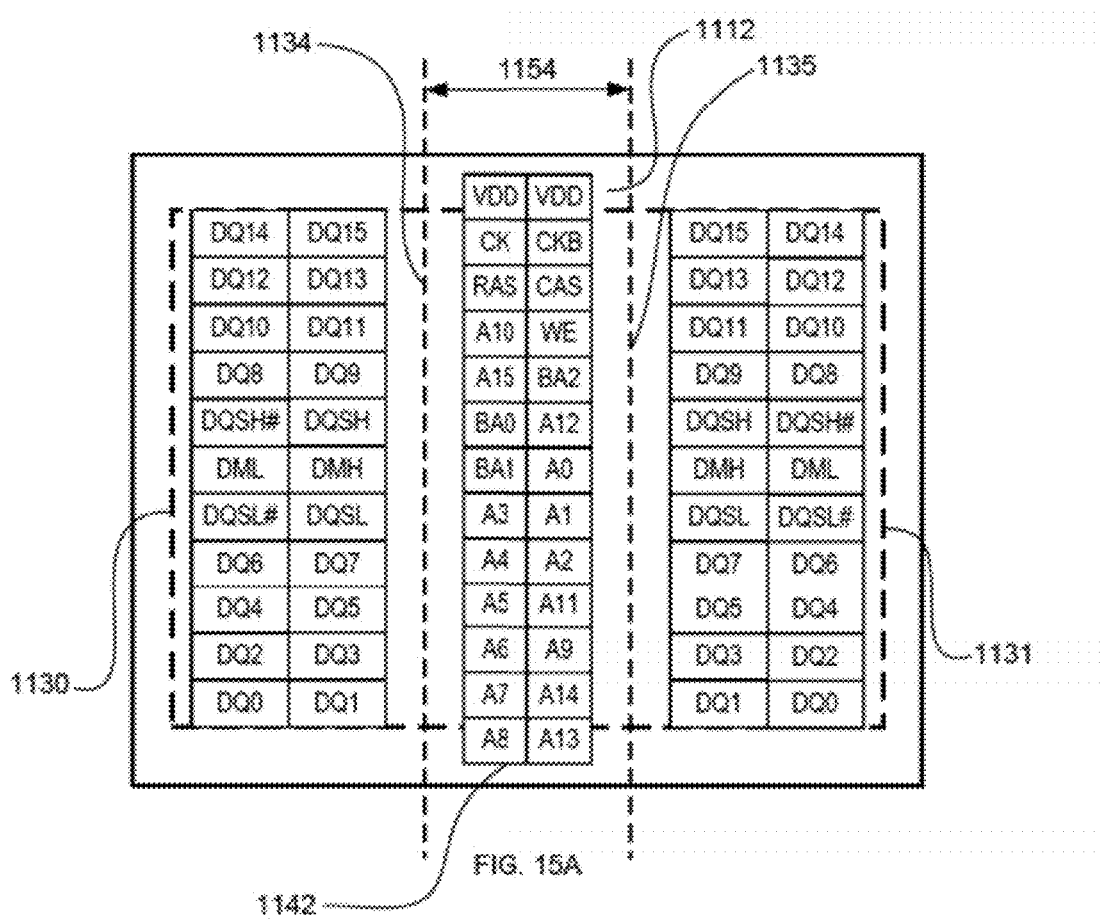
Figure 15B:
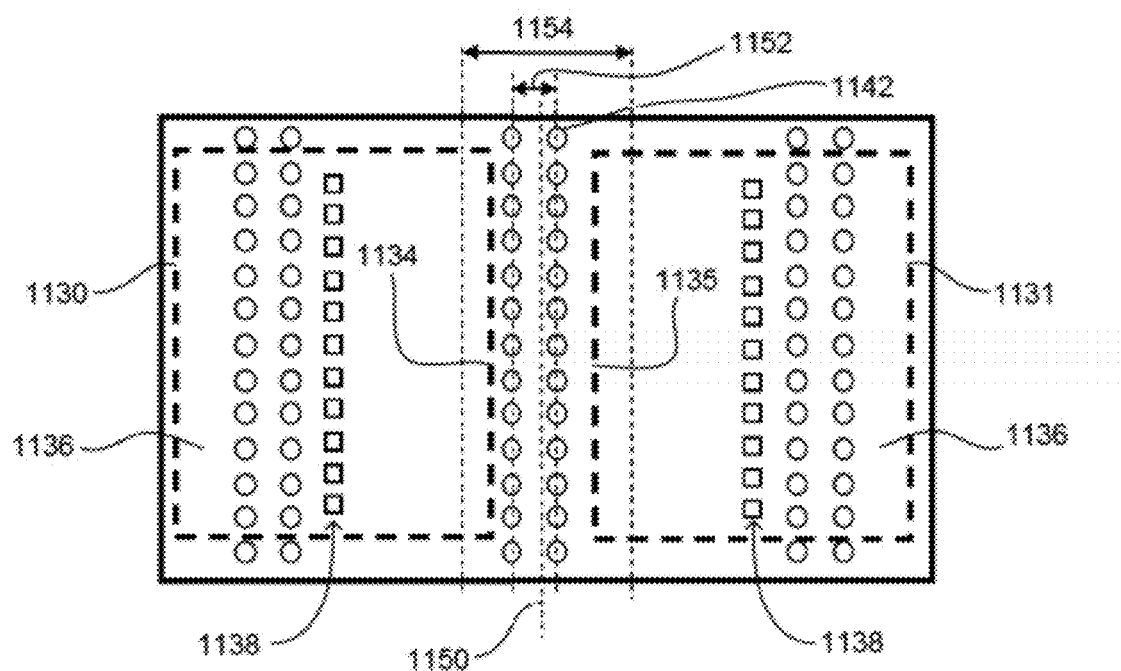
FIG. 15B is a plan view further illustrating a possible placement of terminals on the package of FIGS. 14 and 15A relative to the element contacts on the first and second microelectronic elements therein.

FIGS. 14, 15A and 15B illustrate a microelectronic package 1100 according to a further variation of one or more of the above-described embodiments. As seen in FIG. 14, the package 1100 includes first and second microelectronic elements 1130, 1131, each of which has contacts 1138 facing and joined to corresponding substrate contacts 1140 on a first surface 1120 of the substrate 1102. In turn, some of the substrate contacts 1140 are electrically connected with first terminals 1142 in a central region of the second surface 1110, such as through electrically conductive traces 1144. In some embodiments, some of the substrate contacts 1138 may instead be electrically connected with second terminals 1162 in one or more peripheral regions 1164 of the second surface.

This and other embodiments incorporate more than one microelectronic element therein as described above. A multiple chip package can reduce the amount of area or space required to connect the chips therein to a circuit panel, e.g., printed wiring board to which the package may be electrically and mechanically connected through an array of terminals, such as a ball grid array, land grid array or pin grid array, among others. Such connection space is particularly limited in small or portable computing devices, e.g., handheld devices such as "smartphones" or tablets that typically combine the function of personal computers with wireless connectivity to the broader world. Multi-chip packages can be particularly useful for making large amounts of relatively inexpensive memory available to a system, such as, for example, advanced high performance dynamic random access memory ("DRAM") chips, e.g., in DDR3 type DRAM chips and its follow-ons.

In certain cases, the amount of area of the circuit panel needed to connect the multi-chip package thereto can be reduced by providing common terminals on the package through which at least some signals travel on their way to or from two or more chips within the package. Thus, in the example illustrated in FIGS. 14 and 15A-B, corresponding contacts of multiple chips within the package can be electrically connected with a single common terminal of the package configured to connect with a component external to the package, such as a circuit panel, e.g., printed circuit board, external microelectronic element, or other component.

As in the above-described embodiments, the central region 1112 of the substrate surface 1110 has a width 1154 that is not greater than three and one-half times a minimum pitch 1152 between any two adjacent columns of terminals 1142 on the package, where each of the two adjacent columns has a plurality of terminals therein.

An axial plane 1150 extending in a direction orthogonal to the faces of the microelectronic elements extends in the same first direction in which each column containing a plurality of element contacts extends and is centered among all the columns 1138 of the element contacts of the first and second microelectronic elements 1130, 1131. The axial plane intersects the central region of the substrate. Referring to FIGS. 15A and 15B, one or more columns of first terminals 1142 can be disposed between adjacent edges 1134, 1135 of the first and second microelectronic elements as shown therein, or although not shown, one or more of the columns of first terminals 1142 can overlie one or more of the faces 1136 of the first and second microelectronic elements 1130, 1131. As in the above-described embodiments, there need not be more than a single column 1142 of terminals in the central region. Typically, there will be no more than four columns 1142 of terminals in the central region. As further shown in FIG. 14, the faces 1136 of the first and second microelectronic elements can extend within a single plane 1146 parallel to the first surface 1120 of the substrate 1102.

Figure 16A:
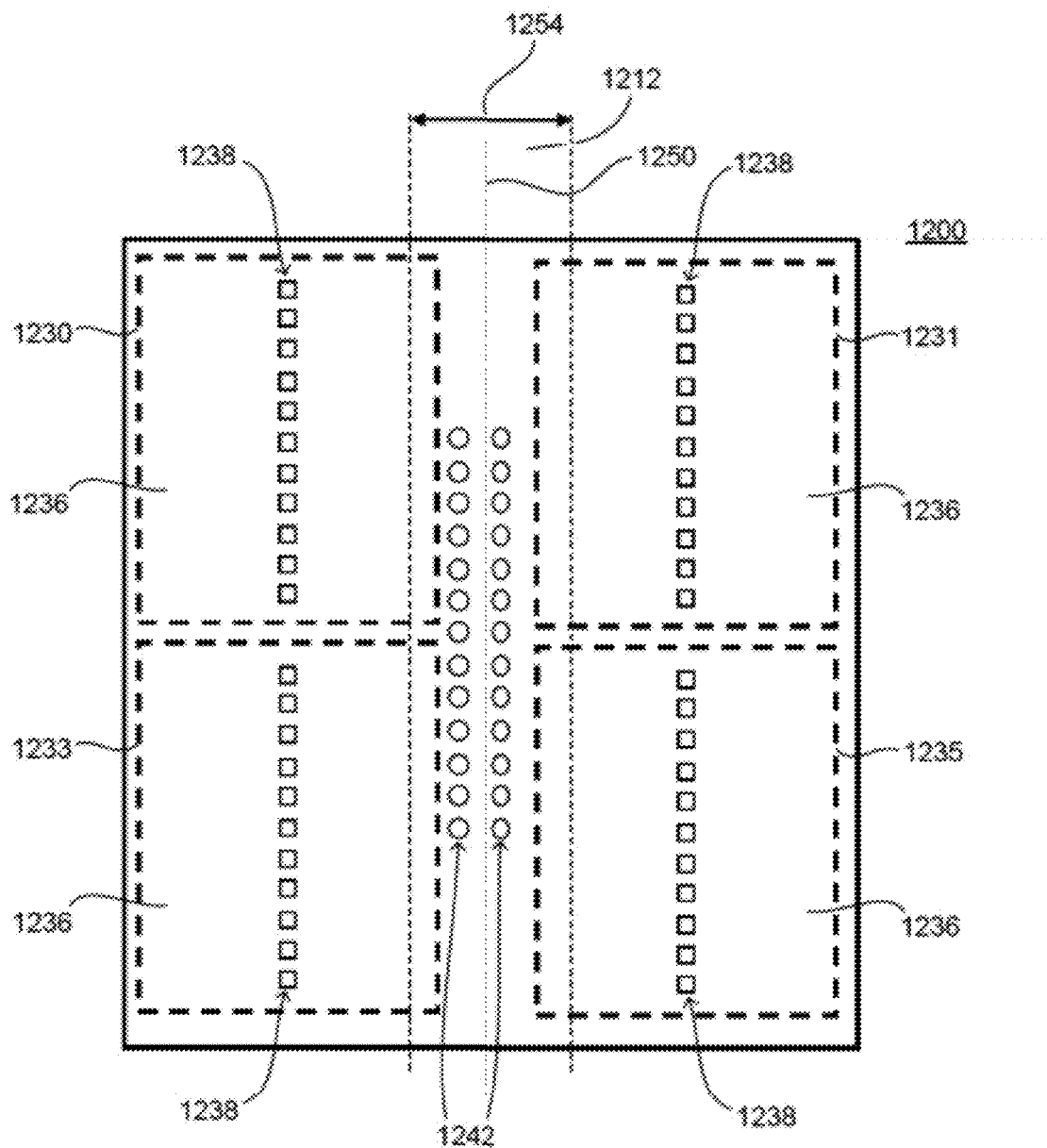
FIG. 16A is a plan view illustrating another embodiment of a microelectronic package having first, second, third and fourth microelectronic elements therein spaced apart from one another on a substrate.
Figure 16B:
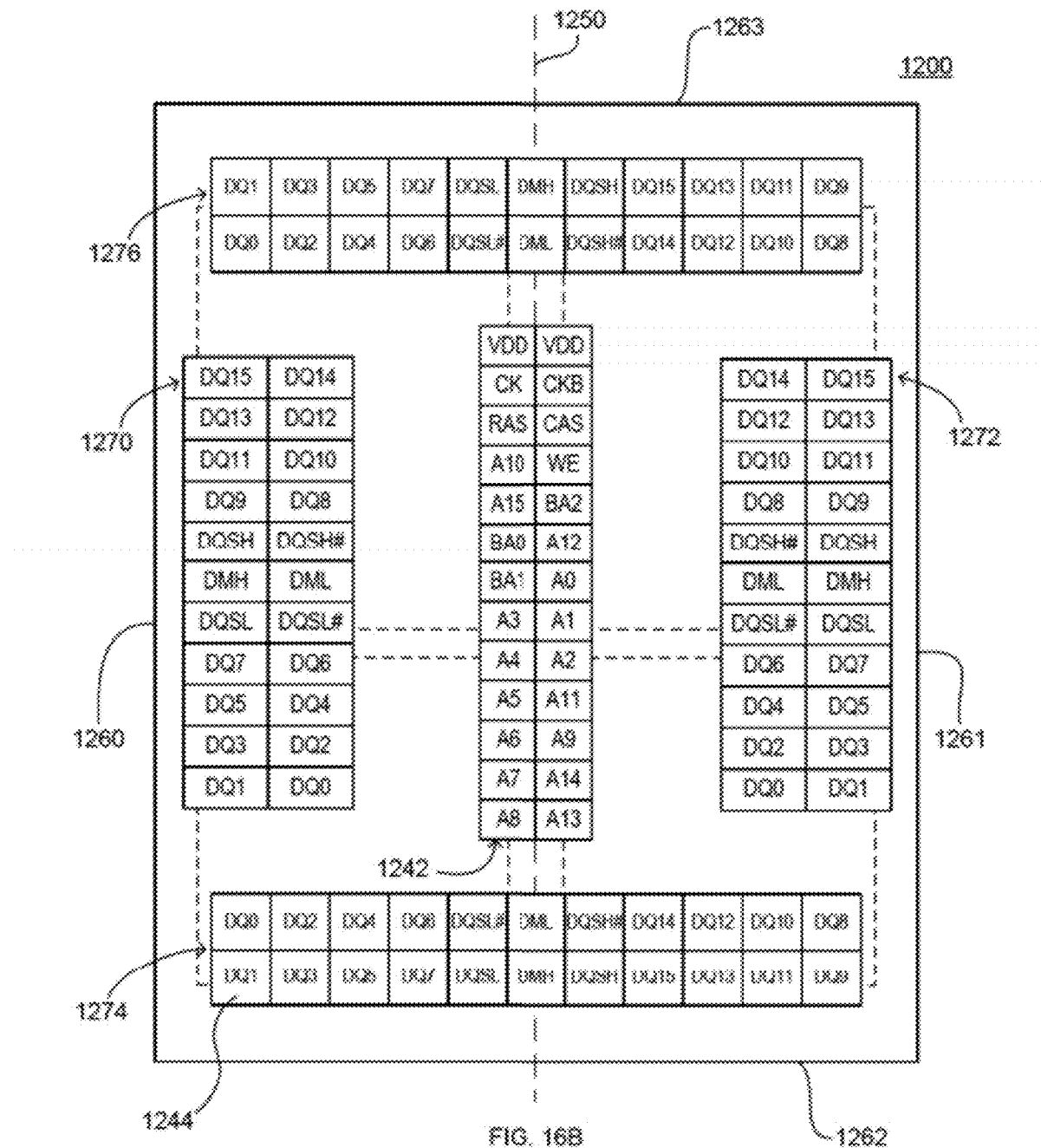
FIG. 16B is a plan view illustrating a possible arrangement and signal assignment of terminals on the microelectronic package according to the embodiment shown in FIG. 16A.

FIGS. 16A-16B illustrate a microelectronic package 1200 according to a variation of the embodiment seen in FIGS. 14, 15A-B which, in addition to first and second microelectronic elements 1230, 1231 having the same arrangement and electrical interconnections within the package 1200 as discussed above regarding microelectronic package 1100 (FIGS. 14, 15A-B), further includes third and fourth microelectronic elements 1233 and 1235. The third and fourth microelectronic elements may each embody a greater number of active devices to provide memory storage array function than any other function. Like the first and second microelectronic elements, the third and fourth microelectronic elements 1233 and 1235 are electrically interconnected with terminals 1242 of the package through element contacts 1238 which face corresponding substrate contacts on a first surface 1120 (FIG. 14) of the substrate and are joined thereto, such as in the flip-chip manner described in the foregoing with reference to FIG. 15A.

The first terminals 1242 of the microelectronic package can be disposed within columns in a central region 1254 having width no greater than three and one-half times the minimum pitch between columns of terminals, as described above. As further shown in FIG. 16A, the axial plane 1250 can be parallel to and centered among all the columns 1238 of element contacts on the faces 1236 of the first, second, third and fourth microelectronic elements within the package 1200. In the example as shown in FIG. 16A, the axial plane 1250 extends in a direction In like manner to that described above relative to FIGS. 14, 15A-B, the faces 1236 of the microelectronic elements 1230, 1231, 1233 and 1235 can be arranged within the package 1200 such that all of the faces 1236 are co-planar, i.e., extend within a single plane, i.e., such as a single plane 1146 as illustrated in FIG. 14.

FIG. 16B illustrates a possible signal assignment of terminals on the package 1200 in which first terminals 1242 are disposed within one or more columns in the central region and second terminals 1244 are disposed at positions within multiple areas near peripheral edges 1260, 1261, 1262 and 1263 of the package. In this case, some second terminals can be disposed at positions within a grid such as grid 1270, and some second terminals can be disposed at positions within a grid such as grid 1272. In addition, some second terminals can be disposed at positions within a grid such as grid 1274, and some second terminals can be disposed at positions within a grid 1276.

Also, as shown in FIG. 16B, the signal class assignments of the second terminals in grid 1274 can be symmetric about the vertical axis 1250, and the signal class assignments of the second terminals in grid 1276 can be symmetric about the vertical axis 1250. As used herein, two signal class assignments can be symmetric with respect to one another if the signal assignments are in the same class of assignments, even if the numerical index within the class differs. Exemplary signal class assignments can include data signals, data strobe signals, data strobe complement signals, and data mask signals. In a particular example, in grid 1274, the second terminals having signal assignments DQSH# and DQSL# are symmetric about the vertical axis 1250 with respect to their signal class assignment, which is data strobe complement, even though those second terminals have different signal assignments.

As further shown in FIG. 16B, the assignments of the data signals to the spatial positions of the second terminals on the microelectronic package, such as for data signals DQ0, DQ1, . . . , for example, can have modulo-X symmetry about the vertical axis 1250. The modulo-X symmetry can help preserve signal integrity in an assembly 300 or 354 such as seen in FIGS. 7C and 7D, in which one or more pairs of first and second packages are mounted opposite one another to a circuit panel, and the circuit panel electrically connects corresponding pairs of second terminals of those first and second packages in each oppositely mounted package pair. When the signal assignments of terminals have "modulo-X symmetry" about an axis, terminals that carry signals which have the same number "modulo-X" are disposed at positions which are symmetric about the axis. Thus, in such assembly 300 or 354 such as in FIGS. 7C, 7D, modulo-X symmetry can permit electrical connections to be made through the circuit panel so that a terminal DQ0 of a first package can be electrically connected through the circuit panel to a terminal DQ8 of the second package which has the same number modulo X (X being 8 in this case), so that the connection can be made in a direction essentially straight through, i.e., normal to, the thickness of the circuit panel.

In one example, "X" can be a number $2^n$ (2 to the power of n), wherein n is greater than or equal to 2, or X can be 8×N, N being two or more. Thus, in one example, X may be equal to the number of bits in a half-byte (4 bits), byte (8 bits), multiple bytes (8×N, N being two or more), a word (32 bits) or multiple words. In such way, in one example, when there is modulo-8 symmetry as shown in FIG. 16B, the signal assignment of a package terminal DQ0 in grid 1274 is configured to carry data signal DQ0 is symmetric about the vertical axis 1250 with the signal assignment of another package terminal DQ8 configured to carry data signal DQ8. Moreover, the same is true for the signal assignments of package terminals DQ0 and DQ8 in grid 1276. As further seen in FIG. 16B, the signal assignments of package terminals DQ2 and DQ10 in grid 1274 have modulo-8 symmetry about the vertical axis, and the same is also true for grid 1276. Modulo-8 symmetry such as described herein can be seen in grids 1274, 1276 with respect to each of the signal assignments of package terminals DQ0 through DQ15.

It is important to note that, although not shown, the modulo number "X" can be a number other than $2^n$ (2 to the power of n) and can be any number greater than two. Thus, the modulo number X upon which the symmetry is based can depend upon how many bits are present in a data size for which the package is constructed or configured. For example, when the data size is 10 bits instead of 8, then the signal assignments may have modulo-10 symmetry. It may even be the case that when the data size has an odd number of bits, the modulo number X can have such number.

Figure 17A:
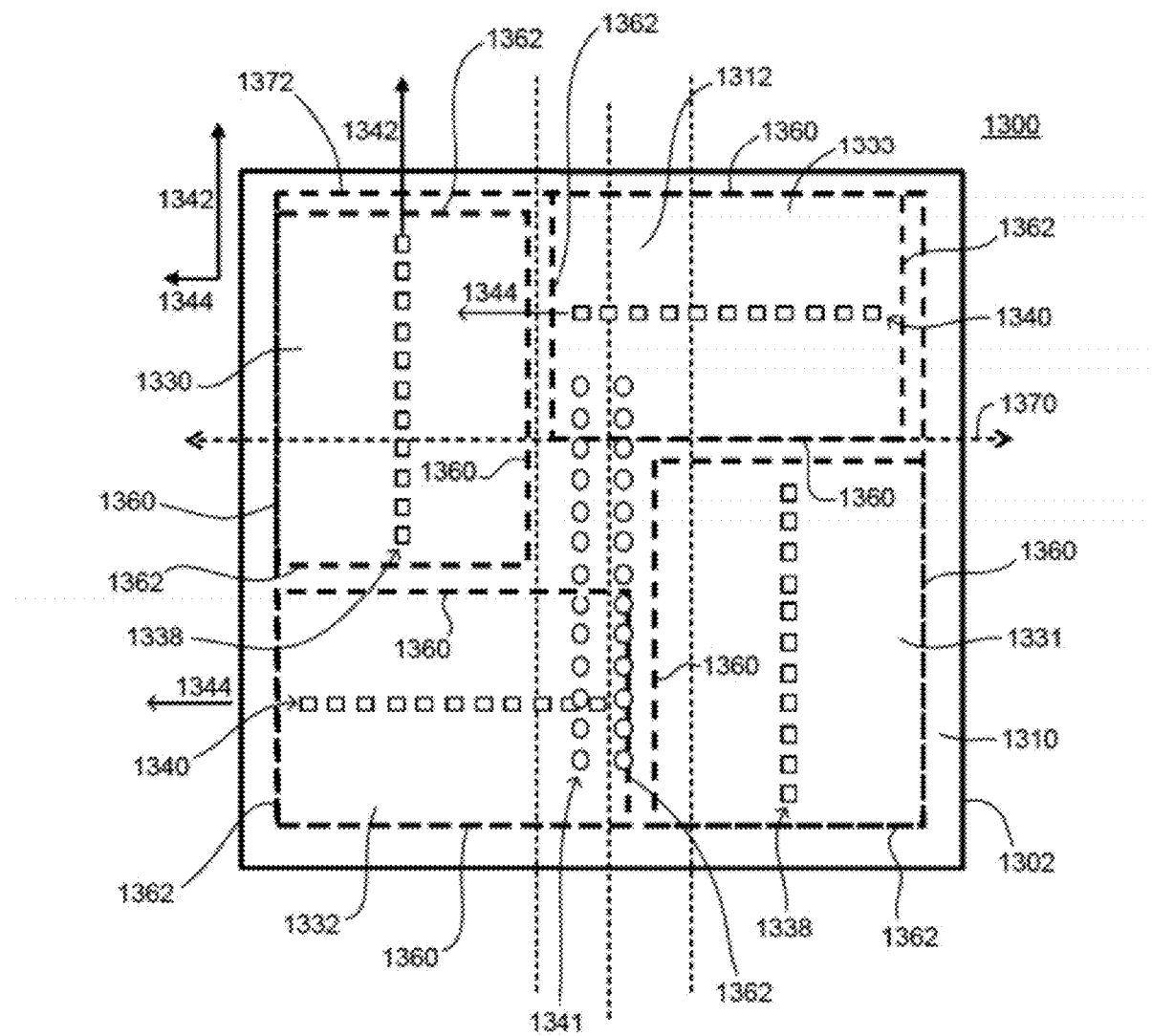
FIG. 17A is a plan view illustrating another embodiment of a microelectronic package having first, second, third and fourth microelectronic elements therein spaced apart from one another in a pinwheel arrangement on a substrate.
Figure 17B:
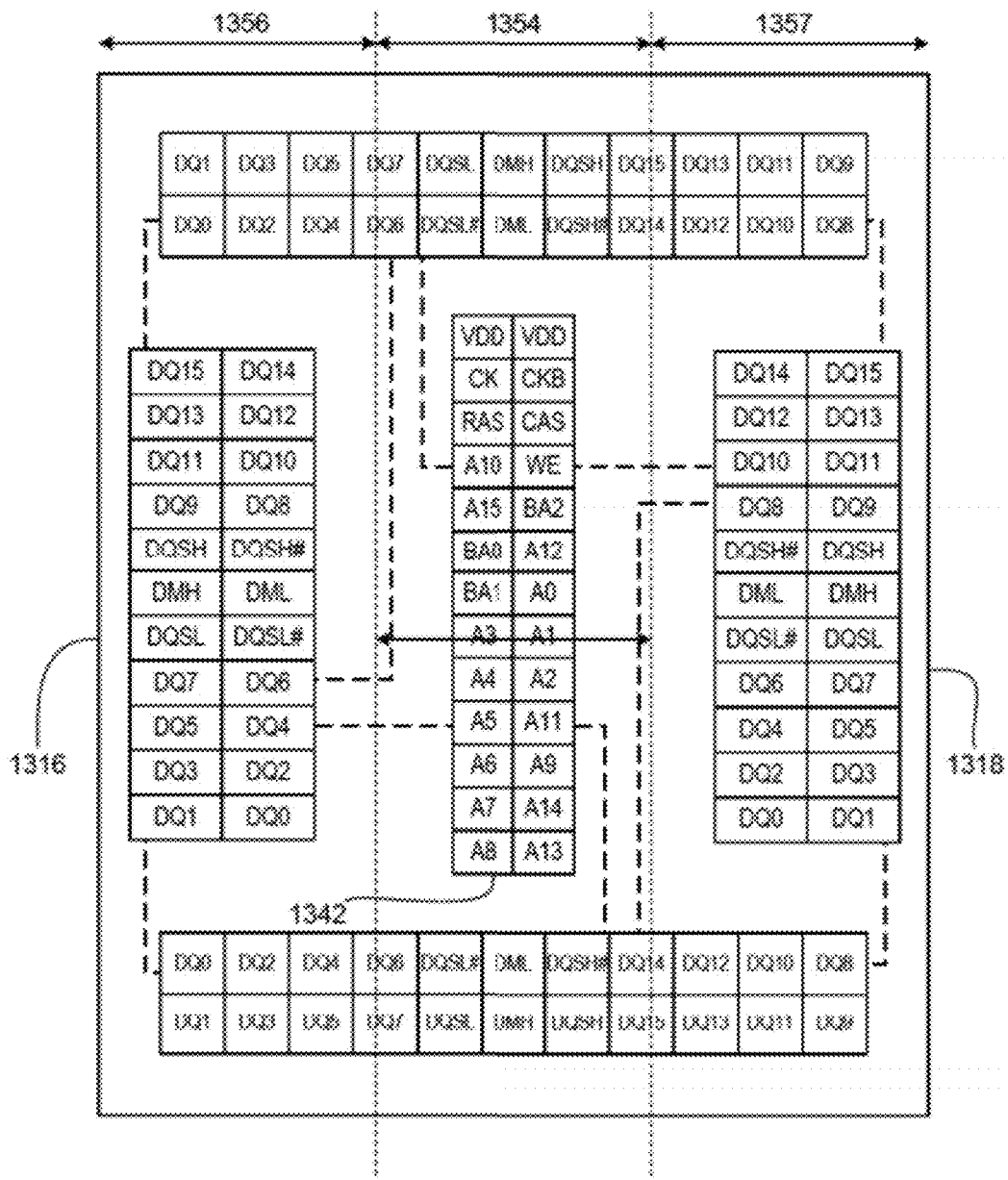
FIG. 17B is a plan view illustrating a possible arrangement and signal assignment of terminals on the microelectronic package according to the embodiment shown in FIG. 17A.

FIGS. 17A-17B illustrate a microelectronic package 1300 according to a variation of the embodiment 1200 described above relative to FIGS. 16A and 16B, the package 1300 having a substrate surface 1310 having a central region 1312 in which first terminals 1341 are disposed. As seen therein, first and second microelectronic elements 1330, 1331 are arranged on substrate 1302 in a manner similar to the arrangement of microelectronic elements 1130, 1131 of microelectronic package 1100 (FIGS. 14, 15A-B), in that the element contacts on these microelectronic elements are disposed at positions within columns which extend in the same first direction 1342. However, as seen in FIG. 17A, third and fourth microelectronic elements 1332 and 1333 have element contacts which are disposed at positions within columns 1340 which extend along the faces of the microelectronic elements 1332, 1333 in another direction 1344 transverse to the first direction 1342. Typically, the other direction 1344 is perpendicular to the first direction 1342.

As further seen in FIGS. 17A-17B, each of the microelectronic elements 1330, 1331, 1332, and 1333 typically has two first parallel edges 1360 which extend in the same direction as the one or more columns of contacts on the respective microelectronic element, and two second parallel edges 1362 which extend in a direction transverse to the direction in which the first edges extend. In some cases, the first edges 1360 of a respective microelectronic element can have greater length than the second edges 1362 of such microelectronic element. However, in other cases, the second edges 1362 can have greater length than the first edges 1360. In the particular package seen in FIG. 17A, a plane 1370 that contains either first edge 1360 of any of the microelectronic elements 1330, 1331, 1332, or 1333 and which is normal to the face of such microelectronic element intersects the edge 1360 of another microelectronic element within the package 1300. As shown in FIG. 17A, the plane 1370 that contains the edge 1360 of microelectronic element 1333 extends in direction 1344 and intersects the edge 1360 of microelectronic element 1330 within the package. In the example shown in FIG. 17A, the plane 1370 intersects the edge 1360 of only one other microelectronic element within the package.

In addition, as further seen in FIG. 17A, the central region 1312 can be further limited. Specifically, FIG. 17A shows that there is a minimum rectangular area 1372 on the surface 1302 of the substrate 1302 which will accommodate the microelectronic elements 1330, 1331, 1332, 1333 as disposed on the substrate surface 1302, and beyond which none of the faces of the first, second, third and fourth microelectronic elements 1330, 1331, 1332 and 1333 extend. In the microelectronic package 1300 depicted in FIGS. 17A-17B, the central region 1312 does not extend beyond any edge of that rectangular area 1372. FIG. 17B further illustrates a possible arrangement of terminals within microelectronic package 1300 in which first terminals 1341 are disposed within the central region 1312 which spans a width in a direction between, i.e., orthogonal to opposed edges 1316, 1318 of the package that is no greater than three and one-half times the minimum pitch between the closest two adjacent columns of terminals on the package. Peripheral regions take up the remaining area of the surface 1310 of the substrate 1302, spanning widths 1356, 1357 between edges of the central region and the opposed edges 1316, 1318 of the package, respectively.

Figure 18A:
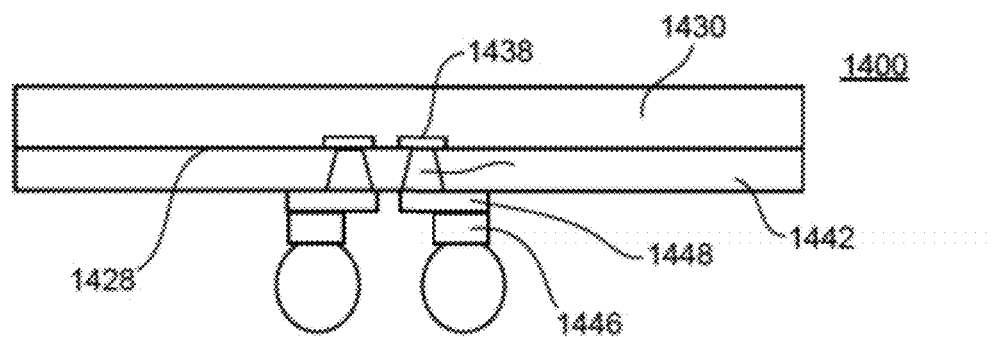
FIG. 18A is a sectional view illustrating a wafer-level microelectronic package according to a variation of the embodiment shown in FIGS. 5 and 6A.

FIG. 18A illustrates a microelectronic package 1400 according to a variation of one or more of the above-described embodiments. In this case, the substrate can be omitted, such that the microelectronic package 1400 can be in form of a microelectronic element 1430 having packaging structure which includes an electrically conductive redistribution layer overlying the front face 1428 of the microelectronic element 1430. The redistribution layer has electrically conductive metallized vias 1440 extending through a dielectric layer 1442 of the package to contacts 1438 of the microelectronic element. The redistribution layer may include terminals 1446 and traces 1448 electrically connected with the terminals 1446, such that the terminals are electrically connected with the contacts 1438, such as through the metallized vias 1440 or through metallized vias 1440 and electrically conductive traces 1448. In this case, the package can be referred to as a "wafer-level package having a redistribution layer thereon."

Figure 18B:
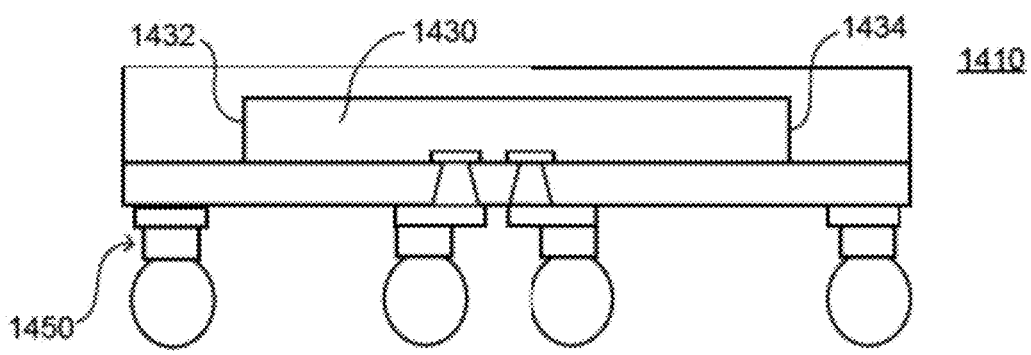
FIG. 18B is a sectional view illustrating a fan-out wafer-level microelectronic package according to a variation of the embodiment shown in FIG. 18A.

FIG. 18B illustrates a microelectronic package 1410 similar to the microelectronic package 1400, with the exception that one or more columns 1450 of second terminals can be disposed on areas of the dielectric layer 1442 which extend beyond one or more edges 1432, 1434 of the microelectronic element 1430. In this case, the package 1410 can be referred to as a "fan-out wafer-level package having a redistribution layer thereon."

Each of the variations and embodiments described above can be applied as well to the packages shown in FIG. 18A or FIG. 18B, and the above-described assembly shown and described above relative to FIG. 7C can incorporate the microelectronic packages shown in FIG. 18A or 18B.

The structures discussed above can be utilized in construction of diverse electronic systems. For example, as shown in FIG. 19 a system 1500 in accordance with a further embodiment of the invention includes a microelectronic package or structure 1506 as described above in conjunction with other electronic components 1508 and 1510. In the example depicted, component 1508 can be a semiconductor chip or microelectronic package whereas component 1510 is a display screen, but any other components can be used. Of course, although only two additional components are depicted in FIG. 19 for clarity of illustration, the system may include any number of such components. The structure 1506 as described above may be, for example, a microelectronic package as discussed above in connection with any of the above-described embodiments. In a further variant, more than one package may be provided, and any number of such packages can be used. Package 1506 and components 1508 and 1510 are mounted in a common housing 1501, schematically depicted in broken lines, and are electrically interconnected with one another as necessary to form the desired circuit. In the exemplary system shown, the system includes a circuit panel 1502 such as a flexible printed circuit panel or circuit board, and the circuit panel includes numerous conductors 1504, of which only one is depicted in FIG. 19, interconnecting the components with one another. However, this is merely exemplary; any suitable structure for making electrical connections can be used. The housing 1501 is depicted as a portable housing of the type usable, for example, in a cellular telephone or personal digital assistant, and screen 1510 is exposed at the surface of the housing. Where structure 1506 includes a light-sensitive element such as an imaging chip, a lens 1511 or other optical device also may be provided for routing light to the structure. Again, the simplified system shown in FIG. 19 is merely exemplary; other systems, including systems commonly regarded as fixed structures, such as desktop computers, routers and the like can be made using the structures discussed above.

Various features of the above-described embodiments of the invention can be combined in ways other than as specifically described above without departing from the scope or spirit of the invention. It is intended for the present disclosure to cover all such combinations and variations of embodiments of the invention described above.

What is claimed is:

1. A microelectronic assembly, comprising
a circuit panel having first and second opposed surfaces and panel contacts at each of the first and second opposed surfaces;
and first and second microelectronic packages having terminals electrically connected with the panel contacts at the first and second surfaces, respectively,
the circuit panel electrically interconnecting at least some terminals of the first microelectronic package with at least some corresponding terminals of the second microelectronic package, each of the first and second microelectronic packages including:
a microelectronic element embodying a greater number of active devices to provide memory storage array function than any other function, the microelectronic element having one or more columns of element contacts each column extending in a first direction along a face of the microelectronic element, such that an axial plane normal to the face of the microelectronic element intersects the face of the microelectronic element along a line extending in the first direction and is centered relative to the one or more columns of element contacts;
a substrate having first and second opposed surfaces and a plurality of substrate contacts at the first surface facing the element contacts and joined thereto;
a plurality of parallel columns of terminals extending in the first direction at the second surface of the substrate, the terminals electrically connected with the substrate contacts and configured to connect the microelectronic package with a component external to the microelectronic package,
the terminals including first terminals exposed in a central region of the second surface of the substrate, the first terminals being configured to carry address information usable by circuitry within the package to determine an addressable memory location from among all the available addressable memory locations of a memory storage array within the microelectronic element, and
wherein the central region has a width in a second direction along the second surface of the substrate transverse to the first direction, the width of the central region not more than three and one-half times a minimum pitch between any two adjacent columns of the parallel columns of the terminals, and the axial plane intersects the central region.

2. The microelectronic assembly as claimed in claim 1, wherein at least some of the first terminals of each of the first and second microelectronic packages are disposed at positions within a grid on the respective package, and the grids are aligned within one ball pitch of one another in x and y orthogonal directions parallel to the first and second circuit panel surfaces.

3. The microelectronic assembly as claimed in claim 2, wherein the grids are aligned with one another in the x and y orthogonal directions such that the at least some first terminals of the grids of each of the first and second microelectronic packages are coincident with one another.

4. The microelectronic assembly as claimed in claim 2, wherein each position of each grid is occupied by one of the terminals.

5. The microelectronic assembly as claimed in claim 2, wherein at least one position of at least one of the grids is not occupied by a terminal.

6. The microelectronic assembly as claimed in claim 2, wherein at least half of the positions of the grids of the first and second packages are aligned with one another in x and y orthogonal directions parallel to the first surface of the circuit panel.

7. The microelectronic assembly as claimed in claim 2, wherein the first terminals disposed at positions within the grid of each microelectronic package are configured to carry all of the address information usable by the circuitry within the respective microelectronic package to determine the addressable memory location.

8. The microelectronic assembly as claimed in claim 2, wherein the first terminals disposed at positions within the grid of each microelectronic package are configured to carry information that controls an operating mode of the microelectronic element of the respective microelectronic package.

9. The microelectronic assembly as claimed in claim 8, wherein the first terminals disposed at positions within the grid of each microelectronic package are configured to carry all of the command signals transferred to the respective microelectronic package, the command signals being write enable, row address strobe, and column address strobe signals.

10. The microelectronic assembly as claimed in claim 2, wherein the first terminals disposed at positions within the grid of each microelectronic package are configured to carry clock signals transferred to such microelectronic packages, each microelectronic package being configured to use the clock signals to sample signals received at the terminals which carry the address information.

11. The microelectronic assembly as claimed in claim 2, wherein the first terminals disposed at positions within the grid of each microelectronic package are configured to carry all of the bank address signals transferred to the respective microelectronic package.

12. The microelectronic assembly as claimed in claim 1, wherein a length of a stub of at least one of electrical connections between one of the first terminals of the first microelectronic package and a corresponding one of the first terminals of the second microelectronic package is less than seven times a minimum pitch of the first terminals on the first microelectronic package.

13. The microelectronic assembly as claimed in claim 12, wherein at least some of the electrical connections through the circuit panel between the first terminals of the first microelectronic package and the first terminals of the second microelectronic package have an electrical length of approximately a thickness of the circuit panel.

14. The microelectronic assembly of claim 12, wherein the total combined length of the conductive elements connecting each pair of electrically coupled first and second panel contacts exposed at the first and second surfaces of the circuit panel is less than seven times a smallest pitch of the panel contacts.

15. A microelectronic assembly as claimed in claim 1, wherein the circuit panel includes a bus having a plurality of conductors configured to carry at least some of the address information transferred to each of the microelectronic packages, the conductors extending in a first direction parallel to the first and second surfaces.

16. The microelectronic assembly as claimed in claim 2, wherein the first terminals of each microelectronic package are disposed at positions within a single column of the grid of the respective microelectronic package, and wherein the circuit panel includes no more than one routing layer for routing of all of the address information between a connection site on the circuit panel at which the terminals of the first and second microelectronic packages are electrically connected and a different connection site at which the terminals of at least a third microelectronic package are electrically connected.

17. The microelectronic assembly as claimed in claim 16, wherein the no more than one routing layer provides routing for command signals, address signals, bank address signals, and clock signals of a command-address bus of the circuit panel between the connection sites.

18. The microelectronic assembly as claimed in claim 1, wherein the circuit panel includes an element having a coefficient of thermal expansion ("CTE") of less than 12 parts per million per degree Celsius ("ppm/° C."), wherein the panel contacts at the first and second surfaces are connected by vias extending through the element.

19. The microelectronic assembly as claimed in claim 18, wherein the element consists essentially of semiconductor, glass, ceramic or liquid crystal polymer material.

20. A module, comprising:
a circuit panel; and
a plurality of microelectronic packages mounted to, and electrically connected with the circuit panel through the terminals of each microelectronic package for transport of signals to and from each microelectronic package, each microelectronic package including:
a microelectronic element embodying a greater number of active devices to provide memory storage array function than any other function, the microelectronic element having one or more columns of element contacts each column extending in a first direction along a face of the microelectronic element, such that an axial plane normal to the face of the microelectronic element intersects the face of the microelectronic element along a line extending in the first direction and is centered relative to the one or more columns of element contacts;
a substrate having first and second opposed surfaces and a plurality of substrate contacts at the first surface facing the element contacts and joined thereto;
a plurality of parallel columns of terminals extending in the first direction at the second surface of the substrate, the terminals electrically connected with the substrate contacts and configured to connect the microelectronic package with a component external to the microelectronic package,
the terminals including first terminals exposed in a central region of the second surface of the substrate, the first terminals being configured to carry address information usable by circuitry within the package to determine an addressable memory location from among all the available addressable memory locations of a memory storage array within the microelectronic element, and
wherein the central region has a width in a second direction along the second surface of the substrate transverse to the first direction, the width of the central region not more than three and one-half times a minimum pitch between any two adjacent columns of the parallel columns of the terminals, and the axial plane intersects the central region.

21. A microelectronic assembly, comprising:
a circuit panel having first and second opposed surfaces and panel contacts at each of the first and second opposed surfaces;
and first and second microelectronic packages having terminals mounted to the panel contacts at the first and second surfaces, respectively,
the circuit panel electrically interconnecting at least some terminals of the first microelectronic package with at least some corresponding terminals of the second microelectronic package, each of the first and second microelectronic packages including:
a microelectronic element embodying a greater number of active devices to provide memory storage array function than any other function, the microelectronic element having one or more columns of element contacts each column extending in a first direction along a face of the microelectronic element, such that an axial plane extending in a direction normal to the face of the microelectronic element intersects the face of the microelectronic element along a line extending in the first direction and centered relative to the one or more columns of element contacts;

packaging structure including:

a dielectric layer having a surface overlying the face of the microelectronic element and facing away from the face of the microelectronic element, and a plurality of terminals exposed at the surface of the dielectric layer, at least some of the terminals being electrically connected with the element contacts through traces extending along the dielectric layer and metallized vias extending from the traces and contacting the element contacts, the terminals disposed at positions within a plurality of parallel columns and being configured for connecting the microelectronic package to at least one component external to the microelectronic package, the terminals including first terminals disposed within at least one column in the central region, the first terminals being configured to carry address information usable by circuitry within the package to determine an addressable memory location from among all the available addressable memory locations of a memory storage array within the microelectronic element, wherein the central region is not wider than three and one-half times a minimum pitch between any two adjacent columns of the terminals, and the axial plane intersects the central region.

22. The microelectronic assembly as claimed in claim 21, wherein at least some of the first terminals of each of the first and second microelectronic packages are disposed at positions within a grid on the respective package, and the grids are aligned within one ball pitch of one another in x and y orthogonal directions parallel to the first and second circuit panel surfaces, wherein the first disposed at positions within each grid are configured to carry information that controls an operating mode of the microelectronic element of the respective microelectronic package.

23. The microelectronic assembly as claimed in claim 22, wherein the first terminals disposed at positions within the grid of each microelectronic package are configured to carry all of the command signals transferred to the respective microelectronic package, the command signals being write enable, row address strobe, and column address strobe signals.

24. The microelectronic assembly as claimed in claim 22, wherein at least some of the electrical connections through the circuit panel between the first terminals of the first and second microelectronic packages have an electrical length of approximately a thickness of the circuit panel.

25. The microelectronic assembly of claim 22, wherein the total combined length of the conductive elements connecting each pair of electrically coupled first and second panel contacts exposed at the first and second surfaces of the circuit panel is less than seven times a smallest pitch of the panel contacts.

26. A system, comprising:

a microelectronic package; and one or more other electronic components electrically connected with the microelectronic package, the microelectronic package including:

a microelectronic element embodying a greater number of active devices to provide memory storage array function than any other function, the microelectronic element having one or more columns of element contacts each column extending in a first direction along a face of the microelectronic element, such that an axial plane normal to the face of the microelectronic element intersects the face of the microelectronic element along a line extending in the first direction and centered relative to the one or more columns of element contacts;

a substrate having first and second opposed surfaces and a plurality of substrate contacts at the first surface facing the element contacts and joined thereto;

a plurality of parallel columns of terminals extending in the first direction at the second surface of the substrate, the terminals electrically connected with the substrate contacts and configured to connect the microelectronic package with a component external to the microelectronic package, the terminals including first terminals exposed in a central region of the second surface of the substrate, the first terminals being configured to carry address information usable by circuitry within the package to determine an addressable memory location from among all the available addressable memory locations of a memory storage array within the microelectronic element, and wherein the central region has a width in a second direction along the second surface of the substrate transverse to the first direction, the width of the central region not more than three and one-half times a minimum pitch between any two adjacent columns of the parallel columns of the terminals, and the axial plane intersects the central region.

27. A system as claimed in claim 26, further comprising a housing, the microelectronic package and the one or more other electronic components being mounted to the housing.

28. A system as claimed in claim 26, wherein the microelectronic package is a first microelectronic package, the system further comprising a second said microelectronic package.

* * * * *